(12) United States Patent
Yuan et al.

(10) Patent No.: US 12,236,892 B2
(45) Date of Patent: Feb. 25, 2025

(54) GATE DRIVER CIRCUIT AND METHOD FOR DRIVING SAME, AND DISPLAY DEVICE

(71) Applicants: Hefei BOE Joint Technology Co., Ltd., Anhui (CN); BOE Technology Group Co., Ltd., Beijing (CN)

(72) Inventors: Zhidong Yuan, Beijing (CN); Yongqian Li, Beijing (CN); Can Yuan, Beijing (CN); Liu Wu, Beijing (CN); Luke Ding, Beijing (CN); Cheng Xu, Beijing (CN); Miao Liu, Beijing (CN); Xing Yao, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/272,595

(22) PCT Filed: Jul. 28, 2022

(86) PCT No.: PCT/CN2022/108535
§ 371 (c)(1),
(2) Date: Jul. 17, 2023

(87) PCT Pub. No.: WO2024/020925
PCT Pub. Date: Feb. 1, 2024

(65) Prior Publication Data
US 2025/0014520 A1 Jan. 9, 2025

(51) Int. Cl.
*G09G 3/32* (2016.01)
*G09G 3/3266* (2016.01)
*G11C 19/28* (2006.01)

(52) U.S. Cl.
CPC ......... *G09G 3/3266* (2013.01); *G11C 19/287* (2013.01); *G09G 2300/0413* (2013.01);
(Continued)

(58) Field of Classification Search
CPC .......... G09G 3/3266; G09G 3/32; G09G 3/30; G09G 2310/0286; G09G 2310/02; G09G 2320/02; G11C 19/287
See application file for complete search history.

(56) References Cited

U.S. PATENT DOCUMENTS 6,252,814 B1 * 6/2001 Tran ....................... G11C 7/227
365/210.1
10,460,656 B2 10/2019 Xi et al.
(Continued)

FOREIGN PATENT DOCUMENTS

CN 105489178 A 4/2016
CN 105719593 A 6/2016
(Continued)

*Primary Examiner* — Pegeman Karimi
(74) *Attorney, Agent, or Firm* — XSENSUS LLP

(57) ABSTRACT

Provided is a gate driver circuit. The gate driver circuit is applicable to a display panel, wherein the display panel includes a plurality of rows of pixels; the gate driver circuit including at least one gate driver sub-circuit; wherein the gate driver sub-circuit includes: at least two shift register groups, wherein each shift register group includes a plurality of shift register units; at least two first dummy units, wherein the at least two first dummy units are respectively coupled to a same input enable terminal and the at least two shift register groups; and at least two second dummy units, wherein the at least two second dummy units are coupled to the at least two shift register groups.

20 Claims, 12 Drawing Sheets

(52) U.S. Cl.
CPC ............... *G09G 2310/0286* (2013.01); *G09G 2320/0233* (2013.01); *G09G 2330/02* (2013.01)

(56) References Cited

U.S. PATENT DOCUMENTS

| | | | |
|---|---|---|---|
| 10,810,921 | B2 | 10/2020 | Tian et al. |
| 10,909,943 | B2 | 2/2021 | Hu et al. |
| 11,004,380 | B2 | 5/2021 | Dai |
| 11,222,570 | B2 | 1/2022 | Cao |
| 2011/0310074 | A1* | 12/2011 | Ochiai ................... G11C 19/28 345/208 |
| 2015/0160766 | A1 | 6/2015 | Park et al. |
| 2018/0190190 | A1 | 7/2018 | Xi et al. |
| 2019/0206293 | A1 | 7/2019 | Tian et al. |
| 2020/0251066 | A1 | 8/2020 | Hu et al. |
| 2020/0312247 | A1* | 10/2020 | Xiong ................... G09G 3/3677 |
| 2021/0020091 | A1* | 1/2021 | Cao ........................... G09G 3/20 |
| 2021/0082334 | A1 | 3/2021 | Dai |
| 2021/0366350 | A1 | 11/2021 | Xue et al. |

FOREIGN PATENT DOCUMENTS

| | | |
|---|---|---|
| CN | 107633807 A | 1/2018 |
| CN | 107967888 A | 4/2018 |
| CN | 108682396 A | 10/2018 |
| CN | 108694903 A | 10/2018 |
| CN | 108898992 A | 11/2018 |
| CN | 108922491 A | 11/2018 |
| CN | 109686333 A | 4/2019 |
| CN | 113920946 A | 1/2022 |
| CN | 114038439 A | 2/2022 |

\* cited by examiner

GATE DRIVER CIRCUIT AND METHOD FOR DRIVING SAME, AND DISPLAY DEVICE

CROSS-REFERENCE TO RELATED APPLICATIONS

This application is a U.S. national stage of international application No. PCT/CN2022/108535, filed on Jul. 28, 2022, the disclosure of which is incorporated herein by reference in its entirety.

TECHNICAL FIELD

The present disclosure relates to the field of display technologies, and in particular, relates to a gate driver circuit and a method for driving the same, and a display device.

BACKGROUND OF THE INVENTION

Organic light emitting diode (OLED) display devices are expected to become the mainstream of the next generation display products due to their advantages of self-luminance, wide viewing angle, fast response and high contrast.

SUMMARY OF THE INVENTION

The present disclosure provides a gate driver circuit and a method for driving the same, and a display device. The technical solutions are as follows.

In some embodiments of the present disclosure, a gate driver circuit is provided. The gate driver circuit is applicable to a display panel, and the display panel includes a plurality of rows of pixels. The gate driver circuit includes at least one gate driver sub-circuit; wherein the gate driver sub-circuit includes:
  at least two shift register groups, wherein each shift register group includes a plurality of shift register units, first output terminals and first input terminals of the plurality of shift register units in each shift register group are sequentially cascaded, and first output terminals and first reset terminals of the plurality of shift register units in the at least two shift register groups are sequentially cascaded;
  at least two first dummy units, wherein the at least two first dummy units are respectively coupled to a same input enable terminal and the at least two shift register groups, and the at least two first dummy units are configured to transmit input signals to the at least two shift register groups based on an input enable signal provided by the input enable terminal, such that each shift register unit transmits the input signal to the first input terminal of another cascaded shift register unit and transmits a reset signal to the first reset terminal of another cascaded shift register unit via the first output terminal; and
  at least two second dummy units, wherein the at least two second dummy units are coupled to the at least two shift register groups and configured to transmit reset signals to the at least two shift register groups based on input signals transmitted by the first output terminals of the plurality of shift register units in the at least two shift register groups;
wherein the first output terminal of each shift register unit is further coupled to at least one row of pixels, and each shift register unit is configured to drive, based on the received signal, the at least one row of pixels to emit light.

In some embodiments, the display panel includes a plurality of display partitions, and each display partition includes at least two rows of pixels; and the gate driver circuit includes: a plurality of gate driver sub-circuits disposed in the plurality of display partitions.

In some embodiments, the gate driver circuit includes: two gate driver sub-circuits disposed in each of the display partitions, wherein the two gate driver sub-circuits are oppositely arranged on two sides of the plurality of rows of pixels in a row direction.

In some embodiments, each row of pixels includes a plurality of columns of pixels, and the plurality of display partitions are sequentially arranged along a column direction;
  the gate driver sub-circuits disposed on a same side are sequentially arranged along the column direction; and
  the first dummy units, the plurality of shift register units, and the second dummy units in each gate driver sub-circuit are sequentially arranged along the column direction.

In some embodiments, the first dummy units in the plurality of gate driver sub-circuits share the same input enable terminal.

In some embodiments, the first output terminals and the first reset terminals of the plurality of shift register units in each shift register group are sequentially cascaded;
  a number of the first dummy units in the gate driver sub-circuit is equal to a number of the shift register groups in the gate driver sub-circuit, and the first dummy units are in one-to-one correspondence with the shift register groups; and
  a number of the second dummy units in the gate driver sub-circuit is equal to the number of the shift register groups in the gate driver sub-circuit, and the second dummy units are in one-to-one correspondence with the shift register groups.

In some embodiments, the gate driver sub-circuit includes: two shift register groups, and two first dummy units and two second dummy units that are both in one-to-one correspondence with the two shift register groups; and a cascade sequence of the units in the gate driver sub-circuit is as follows:
  in each shift register group, a second output terminal of the first dummy unit is coupled to the first input terminal of a first stage of shift register unit, a second input terminal of the first dummy unit is coupled to the input enable terminal, and a second reset terminal of the first dummy unit is coupled to the first output terminal of the first stage of shift register unit;
  in each shift register group, a second output terminal of the second dummy unit is coupled to the first reset terminal of a last stage of shift register unit, and a second input terminal of the second dummy unit is coupled to the first output terminal of the last stage of shift register unit; and
  in each shift register group, from the first stage of shift register unit to the last stage of shift register unit, the first output terminal of a previous stage of shift register unit is coupled to the first input terminal of a next stage of shift register unit, and the first output terminal of the next stage of shift register unit is coupled to the first reset terminal of the previous stage of shift register unit.

In some embodiments, the first output terminals of the plurality of shift register units in each shift register group are coupled to the first reset terminals of the plurality of shift register units in another shift register group;
  a number of the first dummy units in the gate driver sub-circuit is equal to a number of the shift register groups in the gate driver sub-circuit, and the first dummy units are in one-to-one correspondence with the shift register groups; and
  a number of the second dummy units in the gate driver sub-circuit is equal to a difference between stage numbers of two shift register units whose first output terminal and first reset terminal are cascaded in the plurality of shift register units in the at least two shift register groups.

In some embodiments, in the plurality of shift register units in the at least two shift register groups, the first output terminal of an $(n+3)^{th}$ stage of shift register unit is coupled to the first reset terminal of an $n^{th}$ stage of shift register unit, wherein n is greater than 0 and less than or equal to a number of the plurality of shift register units in the at least two shift register groups;
  the gate driver sub-circuit includes: two shift register groups, two first dummy units in one-to-one correspondence with the two shift register groups, and three second dummy units; and
  a cascade sequence of the units in the gate driver sub-circuit is as follows:
  in each shift register group, a second output terminal of the first dummy unit is coupled to the first input terminal of a first stage of shift register unit, a second input terminal of the first dummy unit is coupled to the input enable terminal, and a second reset terminal of the first dummy unit is coupled to the first output terminal of the first stage of shift register unit in the other shift register group;
  in the three second dummy units in the two shift register groups, second input terminals of first two second dummy units are respectively coupled to the first output terminals of the last stage of shift register units in the two shift register groups, a second input terminal of a last second dummy unit is coupled to a second output terminal of a first second dummy unit, and second output terminals of the three second dummy units are respectively coupled to the first reset terminals of the last three stages of shift register units in the plurality of shift register units in the at least two shift register groups; and
  in each shift register group, from the first stage of shift register unit to the last stage of shift register unit, the first output terminal of a previous stage of shift register unit is coupled to the first input terminal of a next stage of shift register unit.

In some embodiments, in the two shift register groups, one of the two shift register groups includes even number stages of shift register units and the other shift register group includes odd number stages of shift register units.

In some embodiments, the first dummy unit and the second dummy unit each include: a pull-up sub-circuit, a pull-down sub-circuit, an inverter sub-circuit and an output sub-circuit; wherein
  the pull-up sub-circuit is coupled to a second input terminal, a first power supply terminal and a first pull-up node, and the pull-up sub-circuit is configured to control coupling or decoupling between the first power supply terminal and the first pull-up node based on a signal received by the second input terminal;
  the pull-down sub-circuit is coupled to a second reset terminal, a second power supply terminal, a first pull-down node, the first pull-up node and a second output terminal, and the pull-down sub-circuit is configured to control coupling or decoupling between the second power supply terminal and the first pull-up node based on a signal received by the second reset terminal and a potential of the first pull-down node, and control coupling or decoupling between the second power supply terminal and the second output terminal based on the potential of the first pull-down node;
  the inverter sub-circuit is coupled to the first pull-up node and the first pull-down node, and the inverter sub-circuit is configured to invert a potential of the first pull-up node and transmit the potential to the first pull-down node; and
  the output sub-circuit is coupled to the first pull-up node, a first clock signal terminal and the second output terminal, and the output sub-circuit is configured to control coupling or decoupling between the first clock signal terminal and the second output terminal based on the potential of the first pull-up node.

In some embodiments, the pull-up sub-circuit includes a first transistor, the pull-down sub-circuit includes a second transistor, a third transistor and a fourth transistor, the inverter sub-circuit includes an inverter, and the output sub-circuit includes a first storage capacitor and a fifth transistor; wherein
  a gate of the first transistor is coupled to the second input terminal, a first electrode of the first transistor is coupled to the first power supply terminal, and a second electrode of the first transistor is coupled to the first pull-up node;
  a gate of the second transistor is coupled to the second reset terminal, a first electrode of the second transistor is coupled to the second power supply terminal, and a second electrode of the second transistor is coupled to the first pull-up node;
  a gate of the third transistor is coupled to the first pull-down node, a first electrode of the third transistor is coupled to the second power supply terminal, and a second electrode of the third transistor is coupled to the first pull-up node;
  an input terminal of the inverter is coupled to the first pull-up node, and an output terminal of the inverter is coupled to the first pull-down node;
  a gate of the fourth transistor is coupled to the first pull-down node, a first electrode of the fourth transistor is coupled to the second power supply terminal, and a second electrode of the fourth transistor is coupled to the second output terminal;
  a gate of the fifth transistor is coupled to the first pull-up node, a first electrode of the fifth transistor is coupled to the first clock signal terminal, and a second electrode of the fifth transistor is coupled to the second output terminal; and
  one terminal of the first storage capacitor is coupled to the first pull-up node, and the other terminal of the first storage capacitor is coupled to the second output terminal.

In some embodiments, each shift register group is further coupled to two clock terminals, and the shift register groups are coupled to different clock terminals;
  in each shift register group, clock signal terminals of two shift register units whose input terminal and output terminal are cascaded are respectively coupled to the two clock terminals, to receive clock signals provided by the two clock terminals; and clock signal terminals of the first dummy units are coupled to different clock terminals, clock signal terminals of the second dummy units are coupled to different clock terminals, and the different clock terminals are clock terminals coupled to the at least two shift register groups, and the first dummy units and the second dummy units are further configured to receive the clock signals.

In some embodiments, the first output terminal of each shift register unit includes a drive output terminal and a shift output terminal; wherein the drive output terminal is coupled to the at least one row of pixels, and the shift output terminal is coupled to the first input terminal of the cascaded shift register unit and the second reset terminal of the first dummy unit, or the second input terminal of the second dummy unit.

In some embodiments, each shift register unit includes: a pull-up transistor, a reset transistor, a total reset transistor, a first pull-down control transistor, a second pull-down control transistor, a third pull-down control transistor, a first pull-down transistor, a second pull-down transistor, a third pull-down transistor, a first output transistor, a second output transistor and a second storage capacitor; wherein a gate of the pull-up transistor is coupled to the first input terminal, a first electrode of the pull-up transistor is coupled to a first input drive terminal, and a second electrode of the pull-up transistor is coupled to a second pull-up node;

a gate of the reset transistor is coupled to the first reset terminal, a first electrode of the reset transistor is coupled to a second input drive terminal, and a second electrode of the reset transistor is coupled to the second pull-up node;

a gate of the total reset transistor is coupled to a total reset terminal, a first electrode of the total reset transistor is coupled to a second power supply terminal, and a second electrode of the total reset transistor is coupled to the second pull-up node;

a gate and a first electrode of the first pull-down control transistor are both coupled to a second clock signal terminal, and a second electrode of the first pull-down control transistor is coupled to a second pull-down node;

a gate of the second pull-down control transistor is coupled to the second pull-up node, a first electrode of the second pull-down control transistor is coupled to the second power supply terminal, and a second electrode of the second pull-down control transistor is coupled to the second pull-down node;

a gate of the third pull-down control transistor is coupled to the shift output terminal, a first electrode of the third pull-down control transistor is coupled to the second power supply terminal, and a second electrode of the third pull-down control transistor is coupled to the second pull-down node;

a gate of the first pull-down transistor is coupled to the second pull-down node, a first electrode of the first pull-down transistor is coupled to the second power supply terminal, and a second electrode of the first pull-down transistor is coupled to the second pull-up node;

a gate of the second pull-down transistor is coupled to the second pull-down node, a first electrode of the second pull-down transistor is coupled to the second power supply terminal, and a second electrode of the second pull-down transistor is coupled to the shift output terminal;

a gate of the third pull-down transistor is coupled to the second pull-down node, a first electrode of the third pull-down transistor is coupled to the second power supply terminal, and a second electrode of the third pull-down transistor is coupled to the drive output terminal;

a gate of the first output transistor is coupled to the second pull-up node, a first electrode of the first output transistor is coupled to a third clock signal terminal, and a second electrode of the first output transistor is coupled to the shift output terminal;

a gate of the second output transistor is coupled to the second pull-up node, a first electrode of the second output transistor is coupled to a fourth clock signal terminal, and a second electrode of the second output transistor is coupled to the drive output terminal; and one terminal of the second storage capacitor is coupled to the second pull-up node, and the other terminal of the second storage capacitor is coupled to the drive output terminal.

In some embodiments of the present disclosure, a method for driving a gate driver circuit is provided. The method is applicable to the gate driver circuit as described in the above embodiments. The method includes:

providing an input enable signal to an input enable terminal, and transmitting, by at least two first dummy units, input signals to at least two shift register groups based on the input enable signal;

transmitting, by the at least two shift register groups via a first output terminal of each shift register unit, an input signal to a first input terminal of another cascaded shift register unit and a reset signal to a first reset terminal of another cascaded shift register unit based on the input signals transmitted by the first dummy units;

transmitting, by at least two second dummy units, reset signals to the at least two shift register groups based on the input signals transmitted by the first output terminals of a plurality of shift register units in the at least two shift register groups; and driving, by each shift register unit, at least one row of coupled pixels to emit light based on the received signal.

In some embodiments of the present disclosure, a display device is provided. The display device includes: a display panel and the gate driver circuit as described in the above embodiments; wherein the display panel includes a plurality of rows of pixels, and the gate driver circuit is coupled to the plurality of rows of pixels and configured to drive the plurality of rows of pixels to emit light.

In some embodiments, the display panel includes a plurality of display partitions, each of the display partitions includes at least two rows of pixels, and the gate driver circuit includes a plurality of gate driver sub-circuits disposed in the plurality of display partitions; wherein each of the gate driver sub-circuits includes at least two shift register groups, at least two first dummy units and at least two second dummy units; and each shift register group includes a plurality of shift register units;

wherein for each display partition, a width of the display partition is greater than or equal to a total width of a plurality of rows of pixels in the display partition, and greater than or equal to a total width of the shift register units, the first dummy units and the second dummy units in one gate driver sub-circuit coupled to the plurality of rows of pixels in the display partition.

In some embodiments, for each display partition, the total width of the shift register units, the first dummy units and the second dummy units in one gate driver sub-circuit coupled to the plurality of rows of pixels in the display partition is less than or equal to the total width of the plurality of rows of pixels in the display partition.

In some embodiments, the width of each shift register unit is less than a width of one row of coupled pixels; and the width of each first dummy unit and the width of each second dummy unit are less than the width of each shift register unit.

BRIEF DESCRIPTION OF DRAWINGS

To describe the technical solutions in the embodiments of the present disclosure more clearly, the following briefly describes the accompanying drawings required for describing the embodiments. The accompanying drawings in the following description show merely some embodiments of the present disclosure, and those of ordinary skill in the art may still derive other drawings from these accompanying drawings without creative effort.

DETAILED DESCRIPTION

To make the objectives, technical solutions, and advantages of the present disclosure clearer, the embodiments of the present disclosure will be further described in detail below with reference to the accompanying drawings.

The OLED display device generally includes a display panel and a gate driver circuit. The display panel includes a plurality of rows of pixels, and the gate driver circuit includes a plurality of shift register units. The plurality of shift register units are coupled to the plurality of rows of pixels in one-to-one correspondence, and the plurality of shift register units are configured to transmit gate drive signals to the plurality of rows of pixels based on the received input signals and reset signals, to drive the plurality of rows of pixels to emit light.

Moreover, the plurality of shift register units are cascaded successively, and each stage of shift register unit other than the first stage of shift register unit can receive an input signal provided by a previous stage of shift register unit, and provide a reset signal for the previous stage of shift register unit. The first stage of shift register unit is further coupled to an input signal terminal to receive an input signal provided by the input signal terminal. The last stage of shift register unit is further coupled to a reset signal terminal to receive a reset signal provided by the reset signal terminal. Consequently, gate drive signals output by different shift register units are different, and the luminance uniformity of the plurality of rows of pixels is poor.

Figure 1:
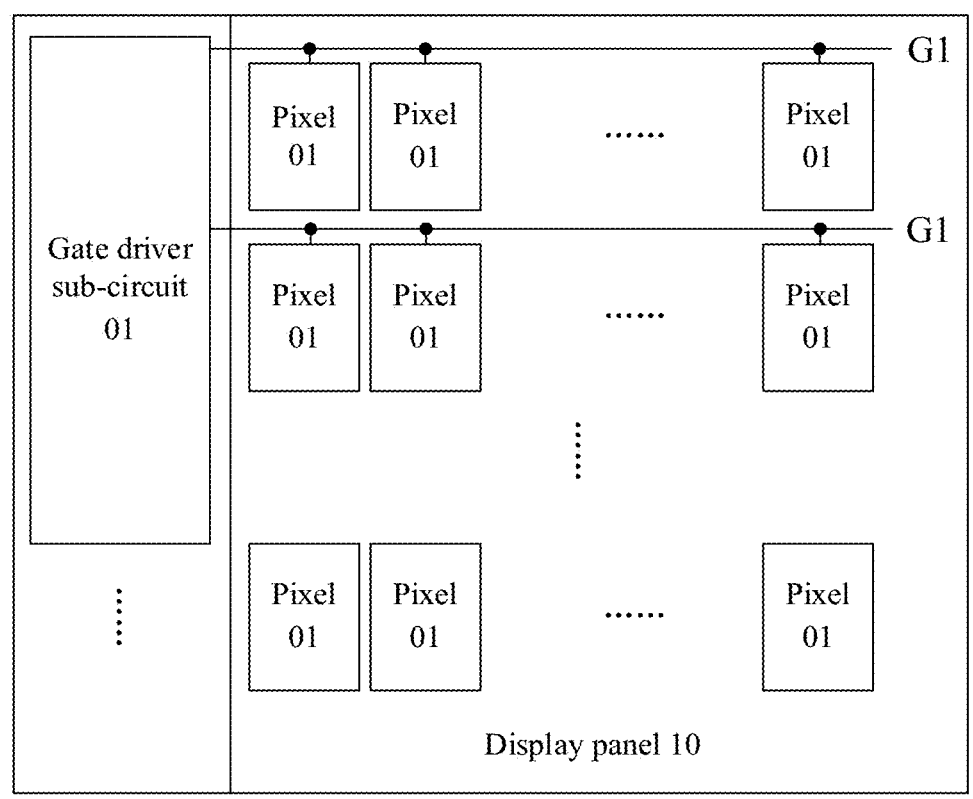
FIG. 1 is a schematic structural diagram of a display panel including a gate driver circuit according to some embodiments of the present disclosure.

FIG. 1 is a schematic structural diagram of a gate driver circuit according to some embodiments of the present disclosure. The gate driver circuit is applied to a display panel 10. Referring to FIG. 1, the display panel 10 includes a plurality of rows of pixels P1. The gate driver circuit includes at least one gate driver sub-circuit 01.

Figure 2:
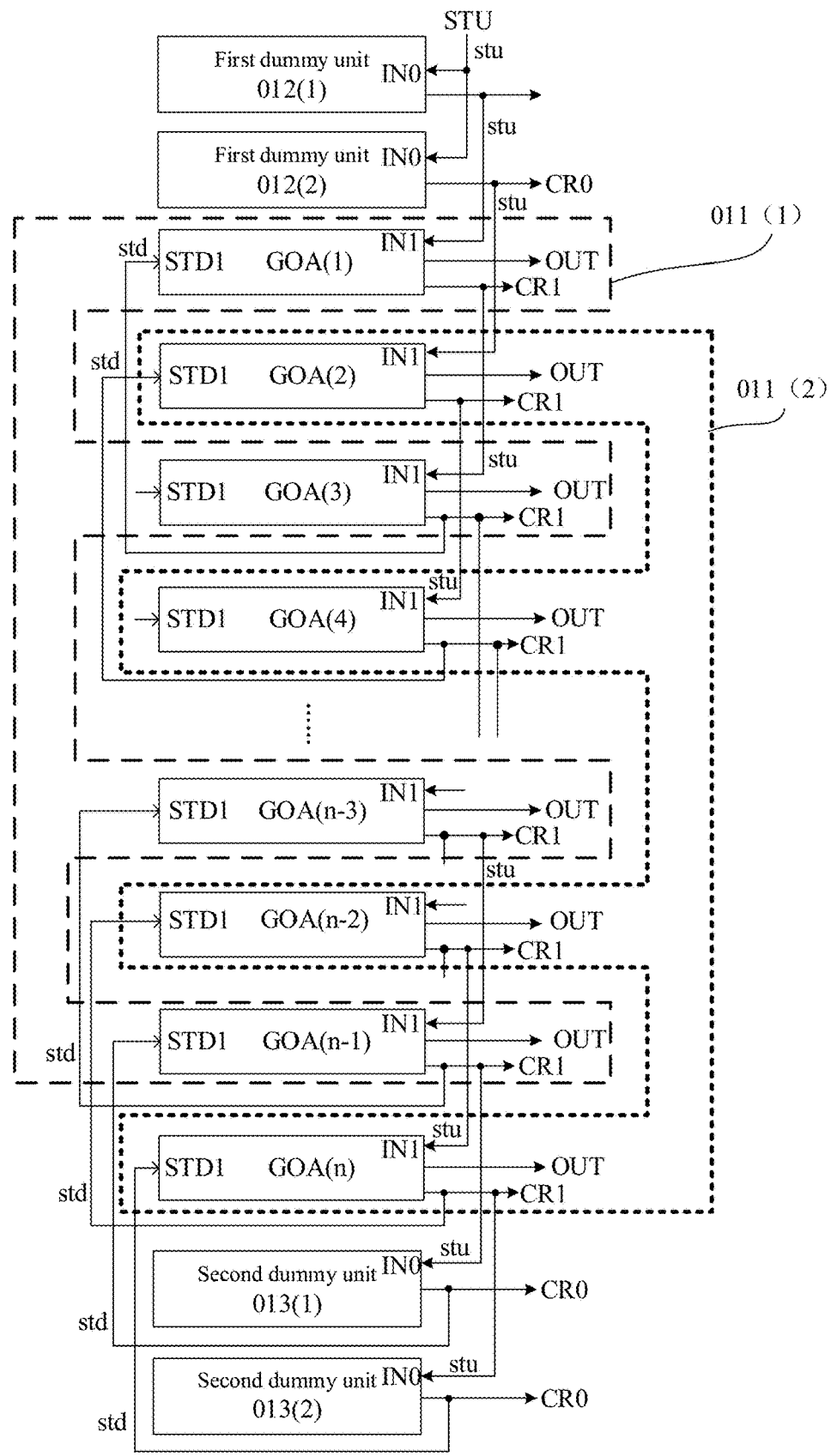
FIG. 2 is a schematic structural diagram of a gate driver sub-circuit according to some embodiments of the present disclosure.

FIG. 2 is a schematic structural diagram of a gate driver sub-circuit on the basis of FIG. 1. Referring to FIG. 2, the gate driver sub-circuit 01 includes:

at least two shift register groups 011, wherein each shift register group 011 includes a plurality of shift register units GOA, first output terminals and first input terminals IN1 of the plurality of shift register units GOA in each shift register group 011 are sequentially cascaded; and first output terminals and first reset terminals STD1 of the plurality of shift register units GOA in the at least two shift register groups 011 are sequentially cascaded;

at least two first dummy units 012, wherein the at least two first dummy units 012 are respectively coupled to the same input enable terminal STU and the at least two shift register groups 011; and the at least two first dummy units 012 are configured to transmit input signals stu to the at least two shift register groups 011 based on an input enable signal provided by the input enable terminal STU, such that each shift register unit GOA transmits, via the first output terminal, the input signal stu to the first input terminal IN1 of another cascaded shift register unit GOA and transmits, via the first output terminal, a reset signal std to the first reset terminal STD1 of another cascaded shift register unit GOA; and at least two second dummy units 013, wherein the at least two second dummy units 013 are coupled to the at least two shift register groups 011; and the at least two second dummy units 013 are configured to transmit reset signals std to the at least two shift register groups 011 based on input signals transmitted by the first output terminals of the plurality of shift register units GOA in the at least two shift register groups 011.

For example, the gate driver sub-circuit 01 shown in FIG. 2 includes a total of n (that is, n stages) shift register units GOA(1) to GOA(n), wherein n is an integer greater than 1. The n shift register units GOA(1) to GOA(n) are grouped into two shift register groups 011(1) and 011(2), that is, the gate driver sub-circuit 01 includes two shift register groups 011. According to the cascade sequence shown in the figure, one shift register group 011(1) includes a first stage of shift register unit GOA(1), a third stage of shift register unit GOA(3), . . . , an $(n-3)^{th}$ stage of shift register unit GOA(n-3) and an $(n-1)^{th}$ stage of shift register unit GOA (n-1); the other shift register group 011(2) includes a second stage of shift register unit GOA(2), a fourth stage of shift register unit GOA(4), . . . , an $(n-2)^{th}$ stage of shift register unit GOA(n-2) and an $n^{th}$ stage of shift register unit GOA (n). In addition, the cascade relationship satisfies: in each shift register group 011, the first output terminal of a previous stage of shift register unit (for example, GOA(1)) is coupled to the first input terminal IN1 of a next stage of shift register unit (for example, GOA(3)), and the first output terminal of the next stage of shift register unit (for example, GOA(3)) is coupled to the first reset terminal STD1 of the previous stage of shift register unit (for example, GOA(1)).

On this basis, still referring to FIG. 2, the gate driver sub-circuit 01 includes two first dummy units 012(1) and 012(2) and two second dummy units 013(1) and 013(2). The cascade relationship between the dummy units and the shift register groups 011 satisfies the followings.

In the two first dummy units 012(1) and 012(2), a second output terminal CR0 of one first dummy unit 012(1) is coupled to the first input terminal IN1 of the first stage of shift register unit GOA(for example, GOA(1)) in one shift register group 011(1), and a second output terminal CR0 of the other first dummy unit 012(2) is coupled to the first input terminal IN1 of the first stage of shift register unit GOA(for example, GOA(2)) in the other shift register group 011(2). In addition, the second input terminals IN0 of the two first dummy units 012(1) and 012(2) are coupled to the same input enable terminal STU.

In the two second dummy units 013(1) and 013(2), a second output terminal CR0 of one second dummy unit 013(1) is coupled to the first reset terminal STD1 of the last stage of shift register unit GOA(for example, GOA(n-1)) in one shift register group 011(1), and a second output terminal CR0 of the other second dummy unit 013(2) is coupled to the first reset terminal STD1 of the last stage of shift register unit GOA(for example, GOA(n)) in the other shift register group 011(2). In addition, the second input terminals IN0 of the two second dummy units 013(1) and 013(2) are respectively coupled to the first output terminals of the shift register units GOA(n-1) and GOA(n).

On the basis of the above coupling, the two first dummy units 012(1) and 012(2) are configured to transmit, in response to an input enable signal provided by the input enable terminal STU, input signals stu to the first input terminals IN1 of the coupled shift register units GOA(1) and GOA(2), respectively.

For the shift register group 011(1), the shift register unit GOA(1) transmits, based on the input signal stu received through its first input terminal IN1, the input signal stu to the cascaded shift register unit GOA(3) via the first output terminal of the shift register unit GOA(1); and the shift register unit GOA(3) transmits, based on the received input signal stu, the reset signal std to the first reset terminal STD1 of the cascaded shift register unit GOA(1) via the first output terminal of the shift register unit GOA(3), and so on. The shift register unit GOA(n-3) transmits, based on the input signal stu received through its first input terminal IN1, the input signal stu to the cascaded shift register unit GOA(n-1) via the first output terminal of the shift register unit GOA (n-3); and the shift register unit GOA(n-1) transmits, based on the received input signal stu, the reset signal std to the first reset terminal STD1 of the cascaded shift register unit GOA(n-3) and the input signal stu to the second input terminal IN0 of the cascaded second dummy unit 013(1) via the first output terminal of the shift register unit GOA(n-1). Then, the cascaded second dummy unit 013(1) transmits, based on the input signal received by its second input terminal IN0, the reset signal std to the first reset terminal STD1 of the cascaded shift register unit GOA(n-1) via the second output terminal CR0 of the second dummy unit 013(1).

Similarly, for the shift register group 011(2), the shift register unit GOA(2) transmits, based on the input signal stu received through its first input terminal IN1, the input signal stu to the cascaded shift register unit GOA(4) via the first output terminal of the shift register unit GOA(2); and the shift register unit GOA(4) transmits, based on the received input signal stu, the reset signal std to the first reset terminal STD1 of the cascaded shift register unit GOA(2) via the first output terminal of the shift register unit GOA(4), and so on. The shift register unit GOA(n-2) transmits, based on the input signal stu received through its first input terminal IN1, the input signal stu to the cascaded shift register unit GOA(n) via the first output terminal of shift register unit GOA(n-2); and the shift register unit GOA(n) transmits, based on the received input signal stu, the reset signal std to the first reset terminal STD1 of the cascaded shift register unit GOA(n-2) and the input signal stu to the second input terminal IN0 of the cascaded second dummy unit 013(2) via the first output terminal of the shift register unit GOA(n). Then, the cascaded second dummy unit 013(2) transmits, based on the second input signal received through its second input terminal IN0, the reset signal std to the first reset terminal STD1 of the cascaded shift register unit GOA(n) via the second output terminal CR0 of second dummy unit 013(2).

With reference to FIG. 1, the first output terminal of each shift register unit GOA is further coupled to at least one row of pixels P1. For example, each shift register unit GOA is coupled to one row of pixels P1, and accordingly, the plurality of shift register units GOA are coupled to a plurality of rows of pixels P1 in one-to-one correspondence. Each shift register unit GOA is configured to drive, based on the received signal, at least one row of pixels P1 to emit light.

For example, with reference to FIG. 2, the shift register units GOA(1) and GOA(2) transmit, based on the received input signal stu and reset signal std respectively, a gate drive signal to at least one row of pixels P1 coupled thereto, to drive the at least one row of pixels P1 to emit light. Other shift register units other than the shift register units GOA(1) and GOA(2) transmits, based on the received input signal stu and reset signal std, a gate drive signal to at least one row of pixels P1 coupled thereof, to drive the at least one row of pixels P1 to emit light.

In some embodiments, still referring to FIG. 2, the first output terminal of each shift register unit GOA includes a drive output terminal OUT and a shift output terminal CR1, and each shift register unit GOA is cascaded with the input terminal and reset terminal of another unit via the shift output terminal CR1, and is coupled to at least one row of pixels P1 via the drive output terminal OUT. In this way, the two output terminals work reliably and independently, which improves the flexibility of controlling the output terminals to output signals, and avoids mutual interference. This applies to the following embodiments and details are not repeated. Certainly, in some other embodiments, each shift register unit GOA alternatively has only one first output terminal, so as to be coupled to the pixels P1 and cascaded with other units.

It should be noted that, different from the shift register units GOA, the first dummy unit 012 and the second dummy unit 013 in the embodiments of the present disclosure are not coupled to the pixels P1 and are not configured to drive the pixels P1 to emit light. However, the operation principle of the first dummy unit 012 and the second dummy unit 013 is basically the same as that of the shift register units GOA. Accordingly, the first dummy unit 012 and the second dummy unit 013 are also referred to as dummy GOAs. Based on the positions of the first dummy unit 012 and the second dummy unit 013, it can be known that the first dummy unit 012 is also referred to as a first row dummy GOA and the second dummy unit 013 is also referred to as a last row dummy GOA.

Therefore, in the embodiments of the present disclosure, the input signal stu received by the first input terminal IN1 of each stage of shift register unit GOA coupled to the pixels P1 comes from the cascaded GOA(including the ordinary GOA coupled to the pixels and the dummy GOA), and the reset signal received by the first reset terminal STD1 of each stage of shift register unit GOA comes from the cascaded GOA(including the GOA coupled to the pixels and the dummy GOA). This eliminates the difference between the gate drive signals output by the first stage of shift register unit GOA and the last stage of shift register unit GOA and the gate drive signals output by other stages of shift register units GOA because the first stage of shift register unit GOA and the last stage of shift register unit GOA need to be coupled to an additional input enable terminal STU and reset signal terminal STD respectively in the prior art, thereby avoiding the luminance difference between the first row of pixels/a plurality of beginning rows of pixels, the last row of pixels/a plurality of ending rows of pixels and the remaining middle rows of pixels. It's ensured that there is no difference or little difference in the gate drive signals transmitted by different stages of shift register units GOA to different rows of pixels P1, thereby ensuring good luminance uniformity of different rows of pixels.

It should be noted that since the at least two shift register groups 011 separately receive input signals stu from different first dummy units 012, the at least two shift register groups 011 can work simultaneously, that is, simultaneously drive the rows of coupled pixels P1 to achieve an overlap in the drive timing. For example, a 50% overlap can be achieved for the two shift register groups 011 shown in FIG. 2, such that the two shift register groups 011 scan simultaneously to illuminate the rows of coupled pixels P1. For example, if there are three shift register groups 011, a 75% overlap can be achieved accordingly. Certainly, in some embodiments, only one shift register group 011 is provided to scan the plurality of rows of pixels P1 in the display panel 10 row by row.

On the basis of at least two shift register groups 011, in the related art, at least two input enable terminals STU need to be provided to be coupled to the at least two shift register groups 011 respectively, which is not conducive to the narrow bezel design and is costly. In the embodiments of the present disclosure, by adding dummy GOAs, only one input enable terminal STU is needed, and at least two first dummy units 012 share the same input enable terminal STU. In addition, since the second dummy units 013 are not configured to drive the pixels P1 to emit light, there is no need to reset the second dummy units 013 providing the reset signals, and thus a reset signal terminal STD is not needed. In this way, the number of the signal terminals is greatly reduced, which facilitates the narrow bezel design of the display panel, saves the cost, and improves the display quality of the display panel.

In summary, the embodiments of the present disclosure provide a gate driver circuit. The gate driver sub-circuit in the gate driver circuit includes at least two shift register groups, at least two first dummy units and at least two second dummy units. Each shift register group includes a plurality of shift register units whose output terminals and input terminals are cascaded in sequence, and the output terminals and reset terminals of the shift register units in the at least two shift register groups are also cascaded in sequence. The at least two first dummy units and the at least two second dummy units are both coupled to the at least two shift register groups and can provide input signals and reset signals for the at least two shift register groups, such that each shift register unit can transmit an input signal to the input terminal of another cascaded shift register unit and can transmit a reset signal to the reset terminal of another cascaded shift register unit. In this way, the gate drive signals output by the shift register units to the pixels are the same, and the luminance uniformity of the plurality of rows of pixels in the display panel is better.

Optionally, the display panel 10 in the embodiments of the present disclosure includes a plurality of display partitions A1, and each display partition A1 includes at least two rows of pixels P1.

Figure 3:
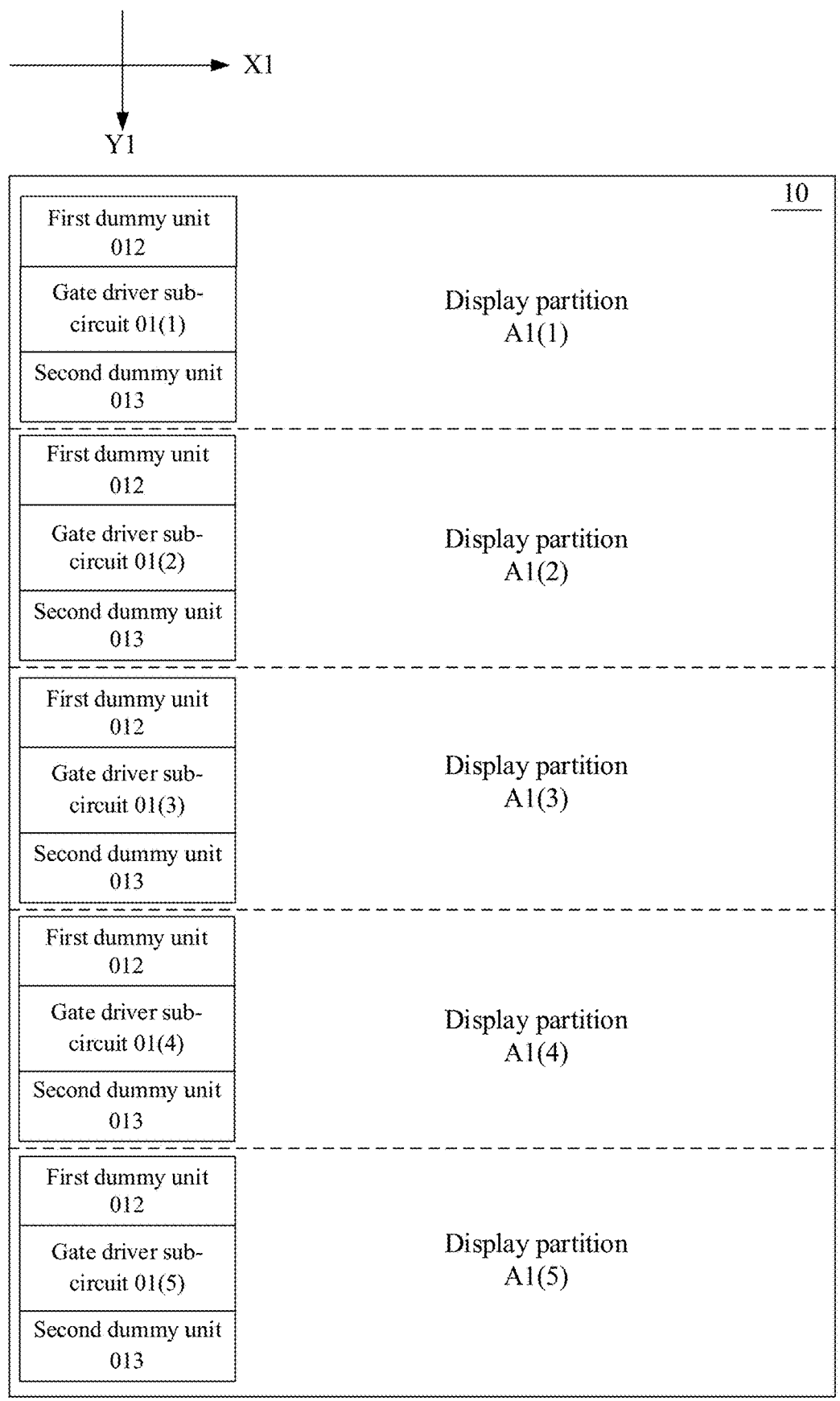
FIG. 3 is a schematic structural diagram of another gate driver circuit according to some embodiments of the present disclosure.

For example, referring to FIG. 3, the display panel 10 includes five display partitions A1(1) to A1(5). Each display partition A1 includes a plurality of rows of pixels P1, which are not shown in the figure. In some embodiments, the various display partitions A1 include the same number of rows of pixels P1. For example, assuming that the display panel 10 includes a total of 1200 rows of pixels, each of the five display partitions A1(1) to A1(5) shown in FIG. 3 includes 240 rows of pixels. In this way, it's ensured that the display uniformity of the display partitions A1 is better. In some other embodiments, the various display partitions A1 include different numbers of rows of pixels P1.

On the basis of the plurality of display partitions A1 in the display panel 10, the gate driver circuit in the embodiments of the present disclosure includes a plurality of gate driver sub-circuits 01 disposed in the plurality of display partitions A1.

For example, still referring to FIG. 3, the gate driver circuit includes one gate driver sub-circuit 01 disposed in each display partition A1, and the gate driver sub-circuit 01 is disposed at any side (for example, the left side as shown in FIG. 3) of a plurality of rows of pixels P1 in a row direction X1 in the display partition A1. Accordingly, in the display panel including five display partitions A1(1) to A1(5) in FIG. 3, the gate driver circuit in the embodiments of the present disclosure includes five gate driver sub-circuits 01(1) to 01(5). The five gate driver sub-circuits 01(1) to 01(5) are disposed in the five display partitions A1(1) to A1(5) in one-to-one correspondence, and each gate driver sub-circuit 01 is coupled to the plurality of rows of pixels P1 in the corresponding display partition A1 to drive the plurality of rows of pixels P1 to emit light.

Figure 4:
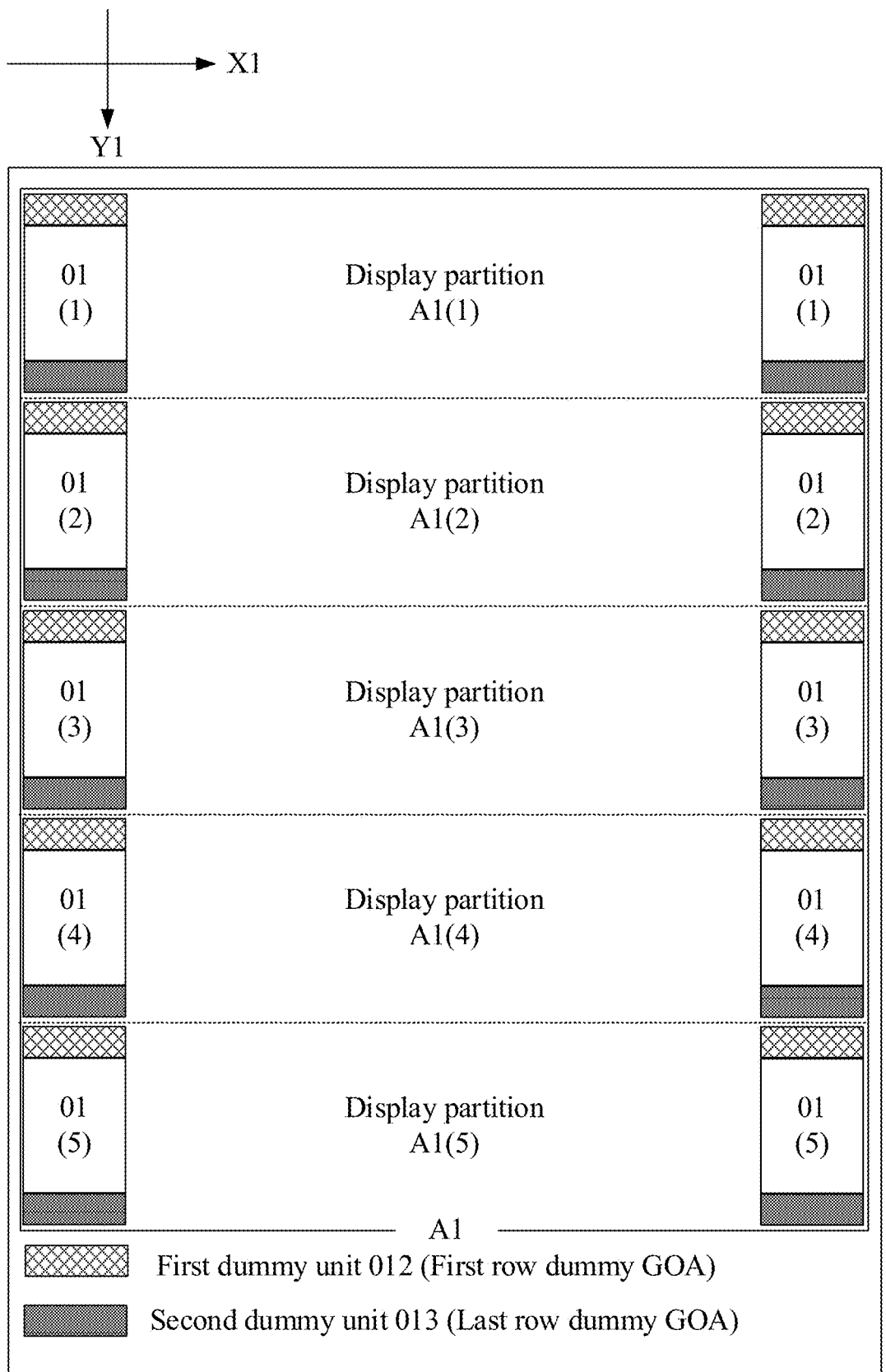
FIG. 4 is a schematic structural diagram of another gate driver circuit according to some embodiments of the present disclosure.

Alternatively, referring to FIG. 4, the gate driver circuit includes two gate driver sub-circuits 01 in each display partition A1, and the two gate driver sub-circuits 01 are oppositely disposed at two sides (for example, the left side and the right side as shown in FIG. 4) of the plurality of rows of pixels P1 in the row direction X1. Accordingly, in the display panel including five display partitions A1(1) to A1(5) in FIG. 3 and FIG. 4, the gate driver circuit in the embodiments of the present disclosure includes a total of 10 gate driver sub-circuits 01(1)*2 to 01(5)*2 in five groups. The five groups of gate driver sub-circuits are disposed in the five display partitions A1(1) to A1(5) in one-to-one correspondence. For example, the two gate driver sub-circuits 01(1) of the first group are disposed in the display partition A1(1), the two gate driver sub-circuits 01(2) of the second group are disposed in the display partition A1(2), the two gate driver sub-circuits 01(3) of the third group are disposed in the display partition A1(3), the two gate driver sub-circuits 01(4) of the fourth group are disposed in the display partition A1(4), and the two gate driver sub-circuits 01(5) of the fifth group are disposed in the display partition A1(5). In addition, the two gate driver sub-circuits 01 (for example, 01(1)) included in each group are oppositely disposed at two sides of the plurality of rows of pixels P1 in the display partition A1 (for example, A1(1)) in the row direction X1, and both the two gate driver sub-circuits 01 in each group are coupled to the plurality of rows of pixels P1 in the corresponding display partition A1 to drive the plurality of rows of pixels P1 to emit light.

Optionally, on the basis that the gate driver circuit includes a plurality of gate driver sub-circuits 01, the first dummy units 012 share the same input enable terminal STU, which can further reduce the number of the input enable terminals STU and reduce the cost.

For the structure shown in FIG. 2 and FIG. 3, in the scenario where no first dummy unit 012 and second dummy unit 013 are added in the prior art, two input enable terminals STU and two reset signal terminals STD are required in each display partition A1 to provide input signals for the first stage of shift register units GOA in the two shift register groups 011 and to provide reset signals for the last stage of shift register units GOA in the two shift register groups 011. Therefore, 2*M input enable terminals STU and 2*M reset signal terminals STD need to be provided in the whole display panel, wherein M is the number of the display partitions A1, which is obviously unacceptable. Moreover, as can be seen from the background, in the prior art, because the first row or a plurality of beginning rows of shift register units GOA receive the input signals provided by the input enable terminals STU, the last row or a plurality of ending rows of shift register units GOA receive the reset signals provided by the reset signal terminals STD, and each of the remaining shift register units GOA receives the input signal and the reset signal transmitted by other cascaded shift register units GOA, there are output differences among the first row/the plurality of beginning rows, the last row/the plurality of ending rows and the middle shift register units GOA, and the output differences lead to poor luminance uniformity among the rows of pixels P1.

In the embodiments of the present disclosure, as can be seen from the structure shown in FIG. 3 and the above embodiments, by adding the first row dummy GOAs and the last row dummy GOAs and setting at least two first row dummy GOAs to share the same input enable terminal STU, not only the display non-uniformity problem can be solved, but also the number of the input enable terminals STUs to be disposed in the display panel can be significantly reduced. Moreover, since the dummy GOAs are not coupled to the pixels P1, there is no need to provide an additional reset signal terminal STD to provide a reset signal for the last row dummy GOAs. The reset terminal of the first row dummy GOA is coupled to the first output terminal (refers to the shift output terminal CR1 herein) of the cascaded shift register unit GOA, to receive the reset signal std provided by the cascaded shift register unit GOA. For example, for the display panel 10 including 5 display partitions A1(1) to A1(5) in FIG. 3, that is, M=5, 10 input enable terminals STU and 10 reset signal terminals STD need to be provided in the prior art, while only one input enable terminal STU needs to be provided and no reset signal terminal STD needs to be provided in the embodiments of the present disclosure. That is, in the scenario of partitioned display, the solution of adding the dummy GOAs provided in the embodiments of the present disclosure is more applicable.

In some embodiments, with reference to FIG. 1, the gate driver sub-circuit 01 is coupled to the plurality of rows of pixels P1 through a plurality of gate lines G1, and the gate lines generally extend in the row direction X1. On this basis, by adopting the layout shown in FIG. 3 and FIG. 4, the space of the display panel 10 can be utilized reasonably, thereby preventing the area of the display panel from being too big and facilitating the narrow bezel design.

Each row of pixels P1 usually includes a plurality of columns of pixels P1, resulting in a large number of pixels. Accordingly, each gate line G1 is generally relatively long. The longer the signal line, the larger the load on the signal line; and the larger the load on the signal line, the bigger the loss of signals transmitted via the signal line. As a result, from the end close to the gate driver sub-circuit 01 to the end away from the gate driver sub-circuit 01, the gate drive signals transmitted to a row of pixels P1 by each shift register unit GOA become smaller. In the case that each row of pixels P1 includes a large number of pixels, if the structure shown in FIG. 3 is adopted, for any row of the plurality of rows of pixels P1, the gate drive signals received by the pixels P1 closer to the gate driver sub-circuit 01 are generally greater than the gate drive signals received by the pixels P1 away from the gate driver sub-circuit 01, which refers to the potential magnitude relationship of the gate drive signals. As a result, along the direction from the end close the gate driver sub-circuit 01 to the end away from the gate driver sub-circuit 01, the luminance of each row of pixels P1 gradually decreases, which results in macroscopic display mura and display abnormality of the display panel.

If the structure shown in FIG. 4 is adopted, the luminance uniformity of the pixels P1 in each row of pixels P1 along the row direction X1 from left to right is better, which can visually eliminate the macroscopic display mura to ensure a better display effect of the display panel. Alternatively, for the structure shown in FIG. 3, some of the shift register units GOA are disposed on the left side and the remaining shift register units GOA are disposed on the right side, such that the luminance of some rows of the plurality of pixels P1 gradually decreases and the luminance of the remaining rows of pixels P1 gradually increases. In this way, the macroscopic display mura can also be visually eliminated to ensure a better display effect of the display panel.

Certainly, in some other embodiments, the display panel 10 includes only one display partition A1. On this basis, with reference to FIG. 3, the gate driver circuit includes only one gate driver sub-circuit 01 disposed in the display partition A1. Alternatively, referring to FIG. 4, the gate driver circuit includes two gate driver sub-circuits 01 disposed in the display partition A1, and the two gate driver sub-circuits 01 are oppositely disposed. In some other embodiments, if the display panel 10 includes a plurality of display partitions A1, some of the display partitions A1 each include one gate driver sub-circuit 01 as shown in FIG. 3 and some of the display partitions A1 each include two gate driver sub-circuits 01 as shown in FIG. 4. Alternatively, each display partition A1 includes more gate driver sub-circuits 01.

As described in the above embodiments, each row of pixels P1 include a plurality of columns of pixels P1, that is, the display panel 10 includes a plurality of pixels arranged in an array. On this basis, it can also be seen with reference to FIG. 3 and FIG. 4 that the plurality of display partitions A1 of the display panel 10 are arranged sequentially along the column direction Y1.

The gate driver sub-circuits 01 on the same side are sequentially arranged along the column direction Y1. The first dummy unit 012, the plurality of shift register units GOA and the second dummy unit 013 included in each gate driver sub-circuit 01 are sequentially arranged along the column direction Y1. The above arrangement can further facilitate the layout and facilitate the narrow bezel design of the display panel.

In some embodiments, in an optional implementation, as can be seen with reference to FIG. 2, the first output terminals (refer to the shift output terminals CR1 herein) of the plurality of shift register units GOA included in each shift register group 011 in the embodiments of the present disclosure are sequentially cascaded with the first reset terminal STD1.

On this basis, the number of the first dummy units 012 included in the gate driver sub-circuit 01 is equal to the number of the shift register groups 011 included in the gate driver sub-circuit 01, and the first dummy units 012 are in one-to-one correspondence with the shift register groups 011. The number of the second dummy units 013 included in the gate driver sub-circuit 01 is equal to the number of the shift register groups 011 included in the gate driver sub-circuit 01, and the second dummy units 013 are in one-to-one correspondence with the shift register groups 011.

Figure 5:
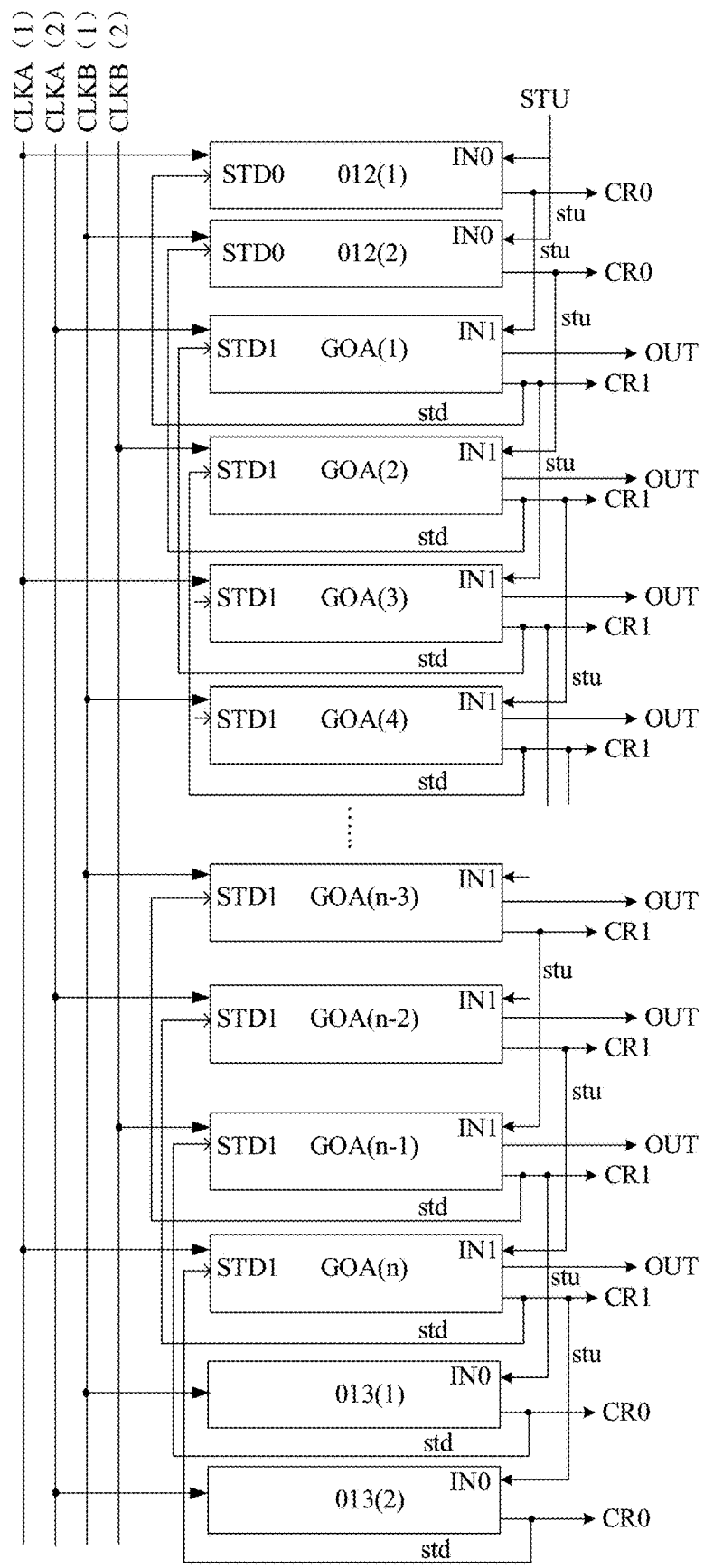
FIG. 5 is a schematic structural diagram of another gate driver sub-circuit according to some embodiments of the present disclosure.

For example, referring to FIG. 2 and FIG. 5, each gate driver sub-circuit 01 includes two shift register groups 011, with 011 being marked only in FIG. 2, and two first dummy units 012 and two second dummy units 013 which are respectively in one-to-one correspondence with the two shift register groups 011. In the figures, the two first dummy units 012 and the two second dummy units 013 are marked as first dummy units 012(1) and 012(2) and second dummy units 013(1) and 013(2). The shift register group 011(1) includes a first stage of shift register unit GOA(1), a third stage of shift register unit GOA(3), . . . , an $(n-3)^{th}$ stage of shift register unit GOA(n-3) and an $(n-1)^{th}$ stage of shift register unit GOA(n-1); the other shift register group 011(2) includes a second stage of shift register unit GOA(2), a fourth stage of shift register unit GOA(4), . . . , an $(n-2)^{th}$ stage of shift register unit GOA(n-2) and an $n^{th}$ stage of shift register unit GOA(n). In addition, the cascade sequence of the units in the gate driver sub-circuit 01 is as follows.

In each shift register group 011, the second output terminal CR0 of the first dummy unit 012 is coupled to the first input terminal IN1 of the first stage of shift register unit GOA, the second input terminal IN0 of the first dummy unit 012 is coupled to the input enable terminal STU, and the second reset terminal STD0 of the first dummy unit 012 is coupled to the first output terminal (refers to the shift output terminal CR1 herein) of the first stage of shift register unit GOA.

For example, in the shift register group 011(1), the second output terminal CR0 of the first dummy unit 012(1) is coupled to the first input terminal IN1 of the shift register unit GOA(1), the second input terminal IN0 of the first dummy unit 012(1) is coupled to the input enable terminal STU, and the second reset terminal STD0 of the first dummy unit 012(1) is coupled to the shift output terminal CR1 of the shift register unit GOA(1). On this basis, the first dummy unit 012(1) transmits an input signal stu to the first input terminal IN1 of the shift register unit GOA(1) based on an input enable signal provided by the input enable terminal STU. The shift register unit GOA(1) transmits a reset signal std to the second reset terminal STD0 of the first dummy unit 012(1) based on the input signal stu received through the first input terminal IN1 of the shift register unit GOA(1).

Similarly, in the shift register group 011(2), the second output terminal CR0 of the first dummy unit 012(2) is coupled to the first input terminal IN1 of the shift register unit GOA(2), the second input terminal IN0 of the first dummy unit 012(2) is coupled to the input enable terminal STU, and the second reset terminal STD0 of the first dummy unit 012(2) is coupled to the shift output terminal CR1 of the shift register unit GOA(2). On this basis, the first dummy unit 012(2) transmits the input signal stu to the first input terminal IN1 of the shift register unit GOA(2) based on the input enable signal provided by the input enable terminal STU. The shift register unit GOA(2) transmits the reset signal std to the second reset terminal STD0 of the first dummy unit 012(2) based on the input signal stu received through the first input terminal IN1 of the shift register unit GOA(2).

In each shift register group 011, the second output terminal CR0 of the second dummy unit 013 is coupled to the first reset terminal STD1 of the last stage of shift register unit GOA, and the second input terminal IN0 of the second dummy unit 013 is coupled to the first output terminal (refers to the shift output terminal CR1 herein) of the last stage of shift register unit GOA.

For example, in the shift register group 011(1), the second output terminal CR0 of the second dummy unit 013(1) is coupled to the first reset terminal STD1 of the shift register unit GOA(n-1), and the second input terminal IN0 of the second dummy unit 013(1) is coupled to the shift output terminal CR1 of the shift register unit GOA(n-1). On this basis, the second dummy unit 013(1) transmits a reset signal std to the first reset terminal STD1 of the shift register unit GOA(n-1) based on the input signal stu transmitted by the shift register unit GOA(n-1).

Similarly, in the shift register group 011(2), the second output terminal CR0 of the second dummy unit 013(2) is coupled to the first reset terminal STD1 of the shift register unit GOA(n), and the second input terminal IN0 of the second dummy unit 013(2) is coupled to the shift output terminal CR1 of the shift register unit GOA(n). On this basis, the second dummy unit 013(2) transmits a reset signal std to the first reset terminal STD1 of the shift register unit GOA(n) based on the input signal stu transmitted by the shift register unit GOA(n).

In each shift register group 011, from the first stage of the shift register unit GOA to the last stage of shift register unit GOA, the first output terminal (herein refers to the shift output terminal CR1) of a previous stage of shift register unit GOA is coupled to the first input terminal IN1 of a next stage of shift register unit GOA, and the first output terminal (herein refers to the shift output terminal CR1) of the next stage of shift register unit GOA is coupled to the first reset terminal STD1 of the previous stage of shift register unit GOA.

For example, in the shift register group 011(1), from the shift register unit GOA(1), the shift output terminal CR1 of the shift register unit GOA(1) is coupled to the first input terminal IN1 of the shift register unit GOA(3). By analogy, the shift output terminal CR1 of the shift register unit GOA(n−3) is coupled to the first input terminal IN1 of the shift register unit GOA(n−1). From the shift register unit GOA(n−1), the shift output terminal CR1 of the shift register unit GOA(n−1) is coupled to the first reset terminal STD1 of the shift register unit GOA(n−3). By analogy, the shift output terminal CR1 of the shift register unit GOA(3) is coupled to the first reset terminal STD1 of the shift register unit GOA(1). On this basis, each stage of shift register unit GOA transmits, via its shift output terminal CR1, an input signal stu to the first input terminal IN1 of another stage of shift register unit GOA cascaded thereto and a reset signal std to the first reset terminal STD1 of another stage of shift register unit GOA cascaded thereto, based on an input signal stu received through the first input terminal IN1 of the shift register unit GOA.

Similarly, in the shift register group 011(2), from the shift register unit GOA(2), the shift output terminal CR1 of the shift register unit GOA(2) is coupled to the first input terminal IN1 of the shift register unit GOA(4). By analogy, the shift output terminal CR1 of the shift register unit GOA(n−2) is coupled to the first input terminal IN1 of the shift register unit GOA(n). From the shift register unit GOA(n), the shift output terminal CR1 of the shift register unit GOA(n) is coupled to the first reset terminal STD1 of the shift register unit GOA(n−2). By analogy, the shift output terminal CR1 of the shift register unit GOA(4) is coupled to the first reset terminal STD1 of the shift register unit GOA(2). On this basis, each stage of shift register unit GOA transmits, via its shift output terminal CR1, an input signal stu to the first input terminal IN1 of another stage of shift register unit GOA cascaded thereto and a reset signal std to the first reset terminal STD1 of another stage of shift register unit GOA cascaded thereto, based on an input signal stu received through the first input terminal IN1 of the shift register unit GOA.

That is, the input signal stu and the reset signal std received by each stage of shift register unit GOA coupled to a plurality of rows of pixels P1 come from another stage of GOA cascaded thereto, but not come from the additional input enable terminal STU or reset signal terminal STD. Accordingly, there is little or no difference in the gate drive signals output from different stages of shift register units GOA to the coupled pixels P1.

In another optional implementation, the first output terminals (refer to the shift output terminals CR1 herein) of the plurality of shift register units GOA included in each shift register group 011 coupled to the first reset terminals STD1 of the plurality of shift register units GOA included in another shift register group 011.

On this basis, the number of the first dummy units 012 included in the gate driver sub-circuit 01 is equal to the number of the shift register groups 011 included in the gate driver sub-circuit 01, and the first dummy units 012 are in one-to-one correspondence with the shift register groups 011.

The number of the second dummy units 013 included in the gate driver sub-circuit 01 is equal to the difference between the stage numbers of two shift register units GOA whose first output terminal (refers to the shift output terminal CR1) and first reset terminal STD1 are cascaded in the plurality of shift register units GOA in the at least two shift register groups 011. It may also be considered that the number of the second dummy units 013 included in the gate driver sub-circuit 01 is equal to the number of the shift register units GOA whose first reset terminals STD1 are not cascaded with the first output terminals in the plurality of shift register units in the at least two shift register groups 011.

Figure 6:
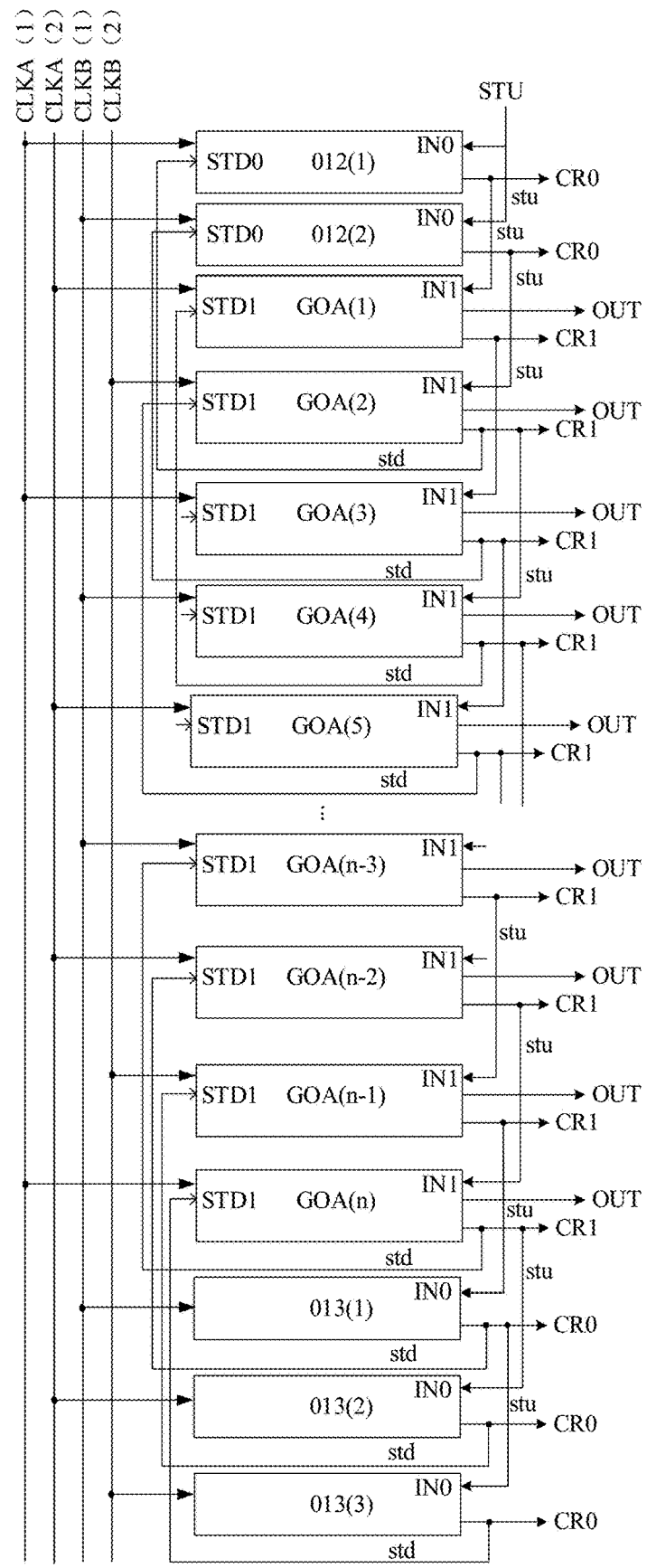
FIG. 6 is a schematic structural diagram of another gate driver sub-circuit according to some embodiments of the present disclosure.

For example, referring to FIG. 6, in the plurality of shift register units GOA included in the at least two shift register groups 011, the first output terminal (refers to the shift output terminal CR1) of the $(n+3)^{th}$ stage of shift register unit GOA(n+3) is coupled to the first reset terminal STD1 of the $n^{th}$ stage of shift register unit GOA(n), wherein n is greater than 0 and less than or equal to the number of the plurality of shift register units GOA included in the at least two shift register groups 011. That is, the difference between the stage numbers of the two shift register units GOA whose first output terminal and first reset terminal STD1 are cascaded is: n+3−n=3.

On this basis, the gate driver sub-circuit 01 includes two shift register groups 011, two first dummy units 012 in one-to-one correspondence with the two shift register groups 011, and three second dummy units 013. The two first dummy units 012 are marked in the figures as first dummy units 012(1) and 012(2), and the three second dummy units 013 are marked as second dummy units 013(1), 013(2) and 013(3). The shift register group 011(1) includes a first stage of shift register unit GOA(1), a third stage of shift register unit GOA(3), . . . , an $(n-3)^{th}$ stage of shift register unit GOA(n−3) and an $(n-1)^{th}$ stage of shift register unit GOA(n−1); and the other shift register group 011(2) includes a second stage of shift register unit GOA(2), a fourth stage of shift register unit GOA(4), . . . , an $(n-2)^{th}$ stage of shift register unit GOA(n−2) and an $n^{th}$ stage of shift register unit GOA(n).

In addition, the cascade sequence of the units in the gate driver sub-circuit 01 is as follows.

In each shift register group 011, the second output terminal CR0 of the first dummy unit 012 is coupled to the first input terminal IN1 of the first stage of the shift register unit GOA, the second input terminal IN0 of the first dummy unit 012 is coupled to the input enable terminal STU, and the second reset terminal STD0 of the first dummy unit 012 is coupled to the first output terminal (refers to the shift output terminal CR1) of the first stage of the shift register unit GOA in the other shift register group 011.

For example, in the shift register group 011(1), the second output terminal CR0 of the first dummy unit 012(1) is coupled to the first input terminal IN1 of the shift register unit GOA(1), the second input terminal IN0 of the first dummy unit 012(1) is coupled to the input enable terminal STU, and the second reset terminal STD0 of the first dummy unit 012(1) is coupled to the shift output terminal CR1 of the shift register unit GOA(2) in the shift register group 011(2). On this basis, the first dummy unit 012(1) transmits an input signal stu to the first input terminal IN1 of the shift register unit GOA(1) based on an input enable signal provided by the input enable terminal STU. The shift register unit GOA(2) transmits a reset signal std to the second reset terminal STD0 of the first dummy unit 012(1) based on the input signal stu received through the first input terminal IN1 of the shift register unit GOA(2).

Similarly, in the shift register group 011(2), the second output terminal CR0 of the first dummy unit 012(2) is coupled to the first input terminal IN1 of the shift register unit GOA(2), the second input terminal IN0 of the first dummy unit 012(2) is coupled to the input enable terminal STU, and the second reset terminal STD0 of the first dummy unit 012(2) is coupled to the shift output terminal CR1 of the shift register unit GOA(3) in the shift register group 011(1). On this basis, the first dummy unit 012(2) transmits the input signal stu to the first input terminal IN1 of the shift register unit GOA(2) based on the input enable signal provided by the input enable terminal STU. The shift register unit GOA(3) transmits a reset signal std to the second reset terminal STD0 of the first dummy unit 012(2) based on the input signal stu received through the first input terminal IN1 of the shift register unit GOA(3).

In the three second dummy units 013(1), 013(2) and 013(3) included in the two shift register groups 011, the second input terminals IN0 of the first two second dummy units 013(1) and 013(2) are respectively coupled to the first output terminals (refer to the shift output terminals CR1) of the last stage of shift register units GOA in the two shift register groups 011.

For example, the second input terminal IN0 of the second dummy unit 013(1) is coupled to the shift output terminal CR1 of the shift register unit GOA(n−1) and receives the input signal stu transmitted by the shift register unit GOA (n−1). The second input terminal IN0 of the second dummy unit 013(2) is coupled to the shift output terminal CR1 of the shift register unit GOA(n) and receives the input signal stu transmitted by the shift register unit GOA(n). The second input terminal IN0 of the last second dummy unit 013(3) is coupled to the second output terminal CR0 of the first second dummy unit 013(1) and receives the input signal stu transmitted by the second dummy unit 013(1) based on the received input signal stu. The second output terminals CR0 of the three second dummy units 013(1), 013(2) and 013(3) are respectively coupled to the first reset terminals STD1 of the last three stages of shift register units GOA in the plurality of shift register units GOA included in the at least two shift register groups 011. For example, the second output terminal CR0 of the second dummy unit 013(1) is coupled to the first reset terminal STD1 of the shift register unit GOA(n−2) and transmits the reset signal std to the first reset terminal STD1 of the shift register unit GOA(n−2). The second output terminal CR0 of the second dummy unit 013(2) is coupled to the first reset terminal STD1 of the shift register unit GOA(n−1) and transmits the reset signal std to the first reset terminal STD1 of the shift register unit GOA(n−1). The second output terminal CR0 of the second dummy unit 013(3) is coupled to the first reset terminal STD1 of the shift register unit GOA(n) and transmits the reset signal std to the first reset terminal STD1 of the shift register unit GOA(n).

In each shift register group 011, from the first stage of the shift register unit GOA to the last stage of shift register unit GOA, the first output terminal (refers to the shift output terminal CR1) of a previous stage of shift register unit GOA is coupled to the first input terminal IN1 of a next stage of shift register unit GOA.

For example, in the shift register group 011(1), from the shift register unit GOA(1), the shift output terminal CR1 of the shift register unit GOA(1) is coupled to the first input terminal IN1 of the shift register unit GOA(3). By analogy, the shift output terminal CR1 of the shift register unit GOA(n−3) is coupled to the first input terminal IN1 of the shift register unit GOA(n−1). On this basis, each stage of shift register unit GOA transmits, via its shift output terminal CR1, an input signal stu to the first input terminal IN1 of another stage shift register unit GOA cascaded thereto based on an input signal stu received through its first input terminal IN1.

Similarly, in the shift register group 011(2), from the shift register unit GOA(2), the shift output terminal CR1 of the shift register unit GOA(2) is coupled to the first input terminal IN1 of the shift register unit GOA(4). By analogy, the shift output terminal CR1 of the shift register unit GOA(n−2) is coupled to the first input terminal IN1 of the shift register unit GOA(n). On this basis, each stage of shift register unit GOA transmits, via its shift output terminal CR1, an input signal stu to the first input terminal IN1 of another stage shift register unit GOA cascaded thereto based on an input signal stu received through its first input terminal IN1.

That is, the input signal stu and the reset signal std received by each stage of shift register unit GOA which is coupled to a plurality of rows of pixels P1 come from another stage of shift register unit GOA cascaded thereto, but not come from the additional input enable terminal STU or reset signal terminal STD. Accordingly, there is little or no difference in the gate drive signals output from different stages of shift register units GOA to the coupled pixels P1.

In some embodiments, as can be seen from FIG. 5 and FIG. 6, in the two shift register groups 011, one shift register group 011 includes even number stages of shift register units GOA and the other shift register group 011 includes odd number stages of shift register units GOA. Certainly, in some other embodiments, the plurality of shift register units GOA are arbitrarily divided into two shift register groups 011, rather than divided according to odd-number and even-number stages.

It should be noted that the shift register groups 011 included in the gate driver sub-circuit 01, and the units included in the shift register groups 011 may alternatively satisfy other numbers and/or satisfy other cascade relationships. For example, there are three shift register groups 011, and correspondingly, there are three first dummy units 012 located at the beginning. The shift output terminal CR1 of the $(n+4)^{th}$ stage of shift register unit GOA(n+4) is coupled to the first reset terminal STD1 of the $n^{th}$ stage of shift register unit GOA(n). Accordingly, there are four second dummy units 013 located at the end. According to the above embodiments, it can be determined that the number of the first dummy units 012 included in the gate driver sub-circuit 01 is actually equal to the number of the shift register units GOA between the shift register units GOA whose shift output terminal CR1 and first input terminal IN1 are cascaded. Similarly, the number of the second dummy units 013 included in the gate driver sub-circuit 01 is equal to the number of the shift register units GOA between the shift register units GOA whose shift output terminal CR1 and first reset terminal STD1 are cascaded.

Figure 7:
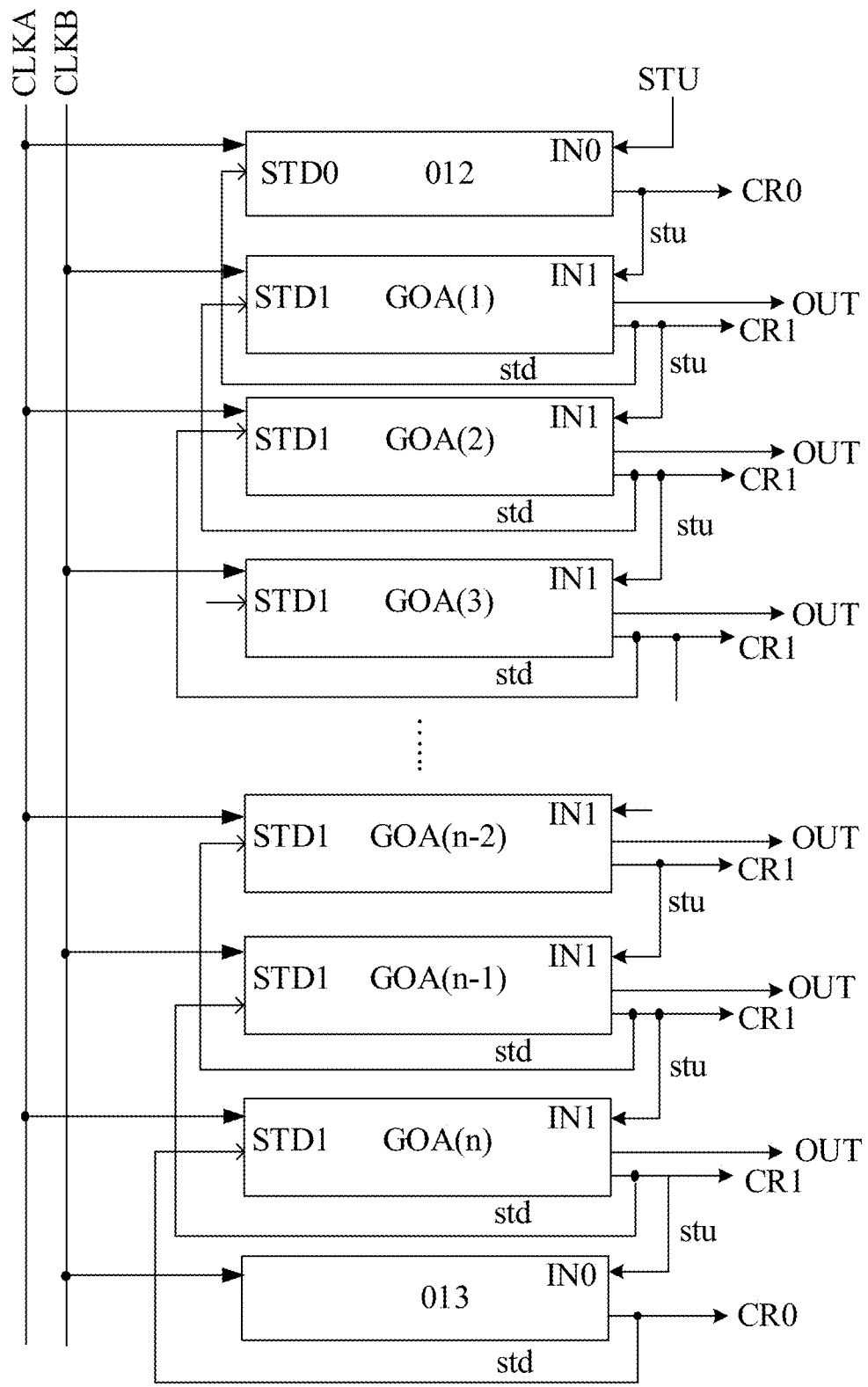
FIG. 7 is a schematic structural diagram of another gate driver sub-circuit according to some embodiments of the present disclosure.

Certainly, in some other embodiments, referring to FIG. 7, the gate driver sub-circuit 01 alternatively includes only one shift register group 011. In every two adjacent shift register units GOA in the shift register group 011, the shift output terminal CR1 of the previous stage of shift register unit GOA is cascaded with the first input terminal IN1 of the next stage of shift register unit GOA, and the shift output terminal CR1 of the next stage of shift register unit GOA is cascaded with the first reset terminal STD1 of the previous stage of shift register unit GOA. Accordingly, only one first dummy unit 012 located at the beginning and one second dummy unit 013 located at the end are provided.

The second input terminal IN0 of the first dummy unit 012 is coupled to the input enable terminal STU and the second output terminal CR0 is coupled to the first input terminal IN1 of the first stage of shift register unit GOA(1), to transmit an input signal stu to the first stage of shift register unit GOA(1) based on the input enable signal provided by the input enable terminal STU. Then, from the first stage of shift register unit GOA(1), each stage of shift register unit GOA sequentially transmits, via the shift output terminal CR1, an input signal stu to the first input terminal IN1 of a next stage shift register unit GOA cascaded thereto based on the input signal stu received through the first input terminal IN1 of each stage of shift register unit GOA. Furthermore, the last stage of shift register unit GOA(n) further transmits, via the shift output terminal CR1, the input signal stu to the second input terminal IN0 of the cascaded second dummy unit 013 based on the input signal stu received through the first input terminal IN1 of the last stage of shift register unit GOA(n). The second dummy unit 013 then transmits, based on the received input signal stu, the reset signal std to the first reset terminal STD1 of the last stage of shift register unit GOA(n). From the last stage of shift register unit GOA(n), each stage of shift register unit GOA sequentially transmits, via the shift output terminal CR1, the reset signal std to the first reset terminal STD1 of the previous stage of shift register unit GOA cascaded thereto based on the input signal stu received through the first input terminal IN1 of each stage of shift register unit GOA.

It should be noted that in the above embodiments, for each shift register group 011, the shift register units GOA are cascaded from the first stage of the shift register unit GOA and the input signal stu and the reset signal std are transmitted sequentially. In some other embodiments, from another stage of shift register unit GOA, the shift register units GOA are cascaded sequentially and the input signal stu and the reset signal std are transmitted. For example, in each shift register group 011, the first input terminal IN1 of an intermediate stage of shift register unit GOA is coupled to the second output terminal CR0 of the first dummy unit 012 and receives the input enable signal, such that each shift register unit GOA transmits, via the shift output terminal CR1, the input signal stu to the first input terminal IN1 of another stage shift register unit GOA cascaded thereto and the reset signal std to the first reset terminal STD1 of another stage of shift register unit GOA cascaded thereto.

In some embodiments, referring to FIG. 5 and FIG. 7, each shift register group 011 is further coupled to two clock terminals, and different shift register groups 011 are coupled to different clock terminals. In each shift register group 011, the clock signal terminals (not marked in the figure) of any two shift register units GOA whose input terminal and output terminal are cascaded are coupled to the two clock terminals respectively, to receive clock signals provided by the two clock terminals. The clock signal terminals (not marked in the figure) of the first dummy units 012 are coupled to different clock terminals, and the clock signal terminals (not marked in the figure) of the second dummy units 013 are coupled to different clock terminals. Herein, the different clock terminals are the clock terminals coupled to the at least two shift register groups 011, and the first dummy unit 012 and the second dummy unit 013 are further configured to receive the clock signals.

For example, referring to FIG. 2, FIG. 5 and FIG. 6, on the basis of disposing two shift register groups 011, the shift register group 011(1) is coupled to two clock terminals CLKA(1) and CLKA(2), and the shift register group 011(2) is coupled to two clock terminals CLKB(1) and CLKB(2). In the shift register group 011(1), from the shift register unit GOA(1), every two adjacent shift register units GOA are respectively coupled to the two clock terminals CLKA(1) and CLKA(2). For example, the shift register unit GOA(1) is coupled to the clock terminal CLKA(1), the shift register unit GOA(3) is coupled to the clock terminal CLKA(2), and so on. In the shift register group 011(2), from the shift register unit GOA(2), every two adjacent shift register units GOA are respectively coupled to the two clock terminals CLKB(1) and CLKB(2). For example, the shift register unit GOA(2) is coupled to the clock terminal CLKB(1), the shift register unit GOA(4) is coupled to the clock terminal CLKB(2), and so on. Thus, it can also be considered that from the first stage of shift register unit GOA(1) to the $n^{th}$ stage of shift register unit GOA(n), every four adjacent shift register units GOA are in one group and are respectively coupled to CLKA(2), CLKB(2), CLKA(1) and CLKB(1). Each group includes different shift register units GOA. The first dummy unit 012(1) and the first dummy unit 012(2) are respectively coupled to the clock terminals CLKA(1) and CLKB(1). For the structure shown in FIG. 5, the second dummy unit 013(1) and the second dummy unit 013(2) are respectively coupled to the clock terminals CLKB(1) and CLKA(2). For the structure shown in FIG. 6, the second dummy unit 013(1), the second dummy unit 013(2) and the second dummy unit 013(3) are respectively coupled to the clock terminals CLKB(1), CLKA(2) and CLKB(2).

In the structure shown in FIG. 7, since there is only one shift register group 011, one first dummy unit 012 and one second dummy unit 013, only two clock terminals CLKA and CLKB are provided to be coupled to every two adjacent GOAs, respectively. For example, from the first stage of shift register unit GOA(1) to the $n^{th}$ stage of shift register unit GOA(n), every two adjacent shift register units GOA are in one group and are respectively coupled to CLKB and CLKA. Each group includes different shift register units GOA. The first dummy unit 012 is coupled to the clock terminal CLKA and the second dummy unit 013 is coupled to the clock terminal CLKB.

Figure 8:
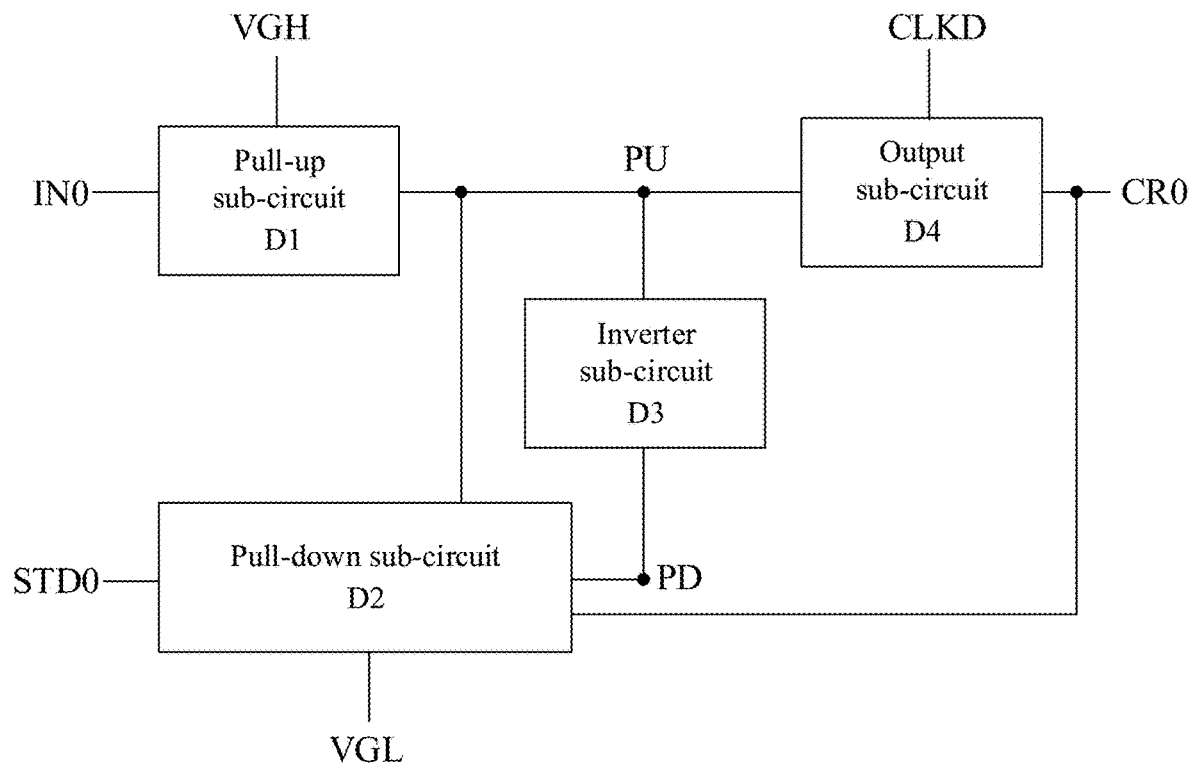
FIG. 8 is a schematic diagram of a circuit structure of a dummy unit according to some embodiments of the present disclosure.

In some embodiments, FIG. 8 is a schematic structural diagram of a dummy unit according to some embodiments of the present disclosure. As shown in FIG. 8, the first dummy unit 012 and the second dummy unit 013 according to the embodiments of the present disclosure each include a pull-up sub-circuit D1, a pull-down sub-circuit D2, an inverter sub-circuit D3 and an output sub-circuit D4.

The pull-up sub-circuit D1 is coupled to the second input terminal IN0, a first power supply terminal VGH and a first pull-up node PU. The pull-up sub-circuit D1 is configured to control the coupling or decoupling between the first power supply terminal VGH and the first pull-up node PU based a signal received by the second input terminal IN0.

For example, when the potential of the signal received by the second input terminal IN0 is at a first potential, the pull-up sub-circuit D1 controls the first power supply terminal VGH to be coupled to the first pull-up node PU. In this case, the first power supply terminal VGH transmits a first power signal at the first potential to the first pull-up node PU, to charge the first pull-up node PU. When the potential of the signal received by the second input terminal IN0 is at a second potential, the pull-up sub-circuit D1 controls the first power supply terminal VGH to be decoupled from the first pull-up node PU.

In some embodiments, the second input terminal IN0 of the first dummy unit 012 is coupled to the input enable terminal STU, to receive the input enable signal transmitted by the input enable terminal STU. The output terminal IN0 of the second dummy unit 013 is coupled to the first output terminal CR1 of the shift register unit GOA, to receive the input signal transmitted by the shift register unit GOA via the first output terminal CR1.

The pull-down sub-circuit D2 is coupled to a second reset terminal STD0, a second power supply terminal VGL, a first pull-down node PD, the first pull-up node PU, and the second output terminal CR0. The pull-down sub-circuit D2 is configured to control the coupling or decoupling between the second power supply terminal VGL and the first pull-up node PU based on a signal received by the second reset terminal STD0 and a potential of the first pull-down node PD, and control the coupling or decoupling between the second power supply terminal VGL and the second output terminal CR0 based on the potential of the first pull-down node PD.

In some embodiments, the second reset terminal STD0 of the first dummy unit 012 is coupled to the shift output terminal CR1 of the shift register unit GOA, to receive the reset signal transmitted by the shift register unit GOA via the shift output terminal CR1. The second reset terminal STD0 of the second dummy unit 013 is coupled to a total reset terminal TRS coupled to the shift register unit GOA, to receive the reset signal transmitted by the total reset terminal TRS. Alternatively, in some embodiments, no second reset terminal STD0 is provided.

For example, when the potential of the signal received by the second reset terminal STD0 is at the first potential and/or the potential of the first pull-down node PD is at the first potential, the pull-down sub-circuit D2 controls the second power supply terminal VGL to be coupled to the first pull-up node PU. In this case, the second power supply terminal VGL transmits a second power supply signal at the second potential to the first pull-up node PU, to reduce noise for the first pull-up node PU. When the potential of the first pull-down node PD is at the first potential, the pull-down sub-circuit D2 controls the second power supply terminal VGL to be coupled to the second output terminal CR0. In this case, the second power supply terminal VGL transmits a second power signal at the second potential to the second output terminal CR0, to reduce noise for the second output terminal CR0. When the potential of the signal received by the second reset terminal STD0 is at the second potential or the potential of the first pull-down node PD is at the second potential, the pull-down sub-circuit D2 controls the second power supply terminal VGL to be decoupled from the first pull-up node PU. When the potential of the first pull-down node PD is at the second potential, the pull-down sub-circuit D2 controls the second power supply terminal VGL to be decoupled from the second output terminal CR0.

The inverter sub-circuit D3 is coupled to the first pull-up node PU and the first pull-down node PD. The inverter sub-circuit D3 is configured to invert the potential of the first pull-up node PU and transmit the potential to the first pull-down node PD.

For example, when the potential of the first pull-up node PU is at the first potential, the inverter sub-circuit D3 inverts the first potential to the second potential and transmits the second potential to the first pull-down node PD, to reduce noise for the first pull-down node PD. Similarly, when the potential of the first pull-up node PU is at the second potential, the inverter sub-circuit D3 inverts the second potential to the first potential and transmits the first potential to the first pull-down node PD, to charge the first pull-down node PD.

The output sub-circuit D4 is coupled to the first pull-up node PU, the first clock signal terminal CLKD, and the second output terminal CR0. The output sub-circuit D4 is configured to control the coupling or decoupling between the first clock signal terminal CLKD and the second output terminal CR0 based on the potential of the first pull-up node PU.

For example, when the potential of the first pull-up node PU is at the first potential, the output sub-circuit D4 controls the first clock signal terminal CLKD to be coupled to the second output terminal CR0. In this case, the clock signal provided by the first clock signal terminal CLKD is transmitted to the second output terminal CR0. In addition, for the first dummy unit 012, the clock signal transmitted to the second output terminal CR0 is further transmitted as the input signal stu to the first input terminal IN1 of the shift register unit GOA. For the second dummy unit 013, the clock signal transmitted to the second output terminal CR0 is further transmitted as the reset signal std to the first reset terminal STD1 of the shift register unit GOA.

Figure 9:
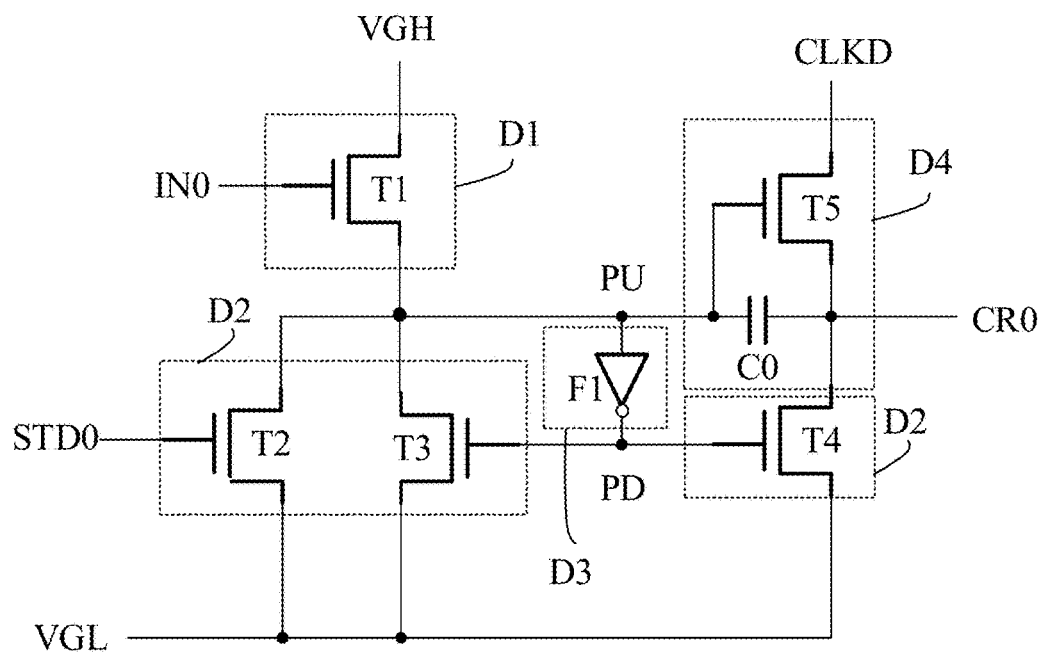
FIG. 9 is a schematic diagram of a circuit structure of another dummy unit according to some embodiments of the present disclosure.

FIG. 9 is a schematic structural diagram of another dummy unit on the basis of FIG. 8. As shown in FIG. 9, the pull-up sub-circuit D1 includes a first transistor T1. The pull-down sub-circuit D2 includes a second transistor T2, a third transistor T3 and a fourth transistor T4. The inverter sub-circuit D3 includes an inverter F1. The output sub-circuit D4 includes a first storage capacitor C0 and a fifth transistor T5.

A gate of the first transistor T1 is coupled to the second input terminal IN0, a first electrode of the first transistor T1 is coupled to the first power supply terminal VGH, and a second electrode of the first transistor T1 is coupled to the first pull-up node PU.

A gate of the second transistor T2 is coupled to the second reset terminal STD0, a first electrode of the second transistor T2 is coupled to the second power supply terminal VGL, and a second electrode of the second transistor T2 is coupled to the first pull-up node PU.

A gate of the third transistor T3 is coupled to the first pull-down node PD, a first electrode of the third transistor T3 is coupled to the second power supply terminal VGL, and a second electrode of the third transistor T3 is coupled to the first pull-up node PU.

An input terminal of the inverter F1 is coupled to the first pull-up node PU, and an output terminal of the inverter F1 is coupled to the first pull-down node PD.

A gate of the fourth transistor T4 is coupled to the first pull-down node PD, a first electrode of the fourth transistor T4 is coupled to the second power supply terminal VGL, and a second electrode of the fourth transistor T4 is coupled to the second output terminal CR0.

A gate of the fifth transistor T5 is coupled to the first pull-up node PU, a first electrode of the fifth transistor T5 is coupled to the first clock signal terminal CLKD, and a second electrode of the fifth transistor T5 is coupled to the second output terminal CR0.

One terminal of the first storage capacitor C0 is coupled to the first pull-up node PU, and the other terminal of the first storage capacitor C0 is coupled to the second output terminal CR0. The first storage capacitor C0 is configured to store the potential at the first pull-up node PU to ensure better output stability.

As can be seen from FIG. 5 to FIG. 7, the first clock signal terminal CLKD is coupled to the clock terminal CLKA or CLKB.

Figure 10:
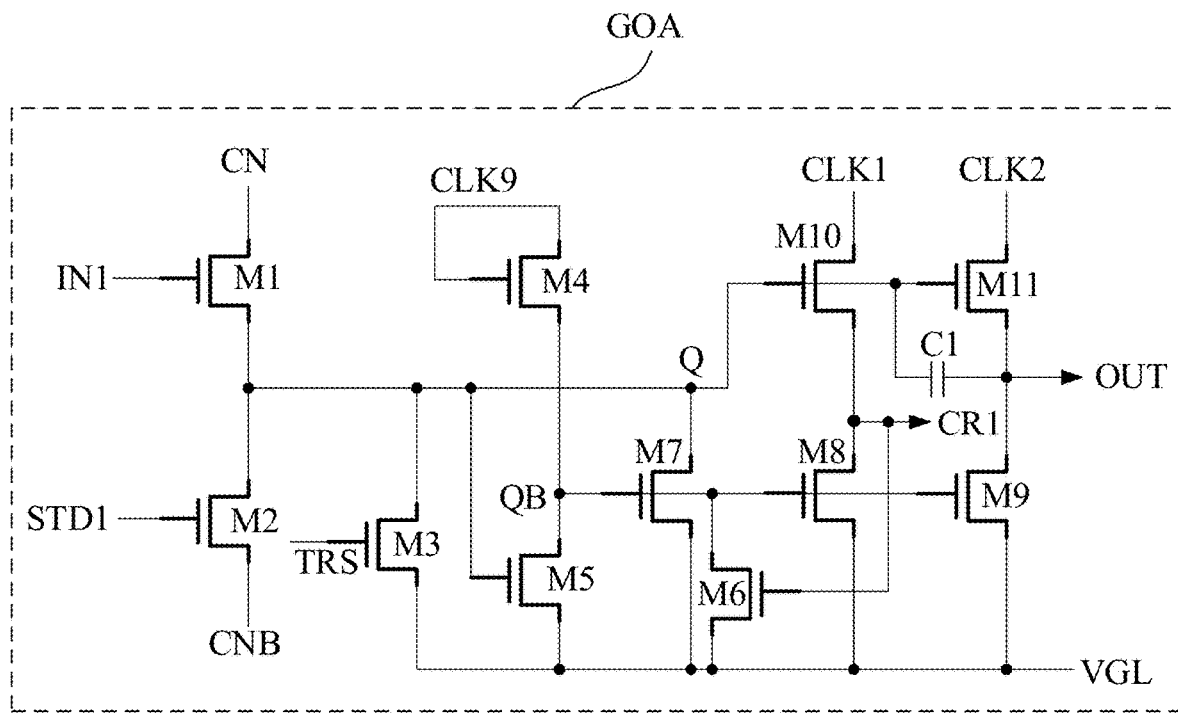
FIG. 10 is a schematic diagram of a circuit structure of a shift register unit according to some embodiments of the present disclosure.

In some embodiments, FIG. 10 is a schematic circuit structure diagram of a shift register unit GOA according to some embodiments of the present disclosure. As can be seen from FIG. 2 and FIG. 10, the first output terminal of each shift register unit GOA includes a drive output terminal OUT and a shift output terminal CR1.

Each shift register unit GOA includes a pull-up transistor M1, a reset transistor M2, a total reset transistor M3, a first pull-down control transistor M4, a second pull-down control transistor M5, a third pull-down control transistor M6, a first pull-down transistor M7, a second pull-down transistor M8, a third pull-down transistor M9, a first output transistor M10, a second output transistor M11 and a second storage capacitor C1.

A gate of the pull-up transistor M1 is coupled to the first input terminal IN1, a first electrode of the pull-up transistor M1 is coupled to a first input drive terminal CN, and a second electrode of the pull-up transistor M1 is coupled to a second pull-up node Q.

A gate of the reset transistor M2 is coupled to the first reset terminal STD1, a first electrode of the reset transistor M2 is coupled to a second input drive terminal CNB, and a second electrode of the reset transistor M2 is coupled to the second pull-up node Q.

A gate of the total reset transistor M3 is coupled to a total reset terminal TRS, a first electrode of the total reset transistor M3 is coupled to the second power supply terminal VGL, and a second electrode of the total reset transistor M3 is coupled to the second pull-up node Q.

A gate and a first electrode of the first pull-down control transistor M4 are both coupled to a second clock signal terminal CLK9, and a second electrode of the first pull-down control transistor M4 is coupled to a second pull-down node QB.

A gate of the second pull-down control transistor M5 is coupled to the second pull-up node Q, a first electrode of the second pull-down control transistor M5 is coupled to the second power supply terminal VGL, and a second electrode of the second pull-down control transistor M5 is coupled to the second pull-down node QB.

A gate of the third pull-down control transistor M6 is coupled to the shift output terminal CR1, a first electrode of the third pull-down control transistor M6 is coupled to the second power supply terminal VGL, and a second electrode of the third pull-down control transistor M6 is coupled to the second pull-down node QB.

A gate of the first pull-down transistor M7 is coupled to the second pull-down node QB, a first electrode of the first pull-down transistor M7 is coupled to the second power supply terminal VGL, and a second electrode of the first pull-down transistor M7 is coupled to the second pull-up node Q.

A gate of the second pull-down transistor M8 is coupled to the second pull-down node QB, a first electrode of the second pull-down transistor M8 is coupled to the second power supply terminal VGL, and a second electrode of the second pull-down transistor M8 is coupled to the shift output terminal CR1.

A gate of the third pull-down transistor M9 is coupled to the second pull-down node QB, a first electrode of the third pull-down transistor M9 is coupled to the second power supply terminal VGL, and a second electrode of the third pull-down transistor M9 is coupled to the drive output terminal OUT.

A gate of the first output transistor M10 is coupled to the second pull-up node Q, a first electrode of the first output transistor M10 is coupled to a third clock signal terminal CLK1, and a second electrode of the first output transistor M10 is coupled to the shift output terminal CR1.

A gate of the second output transistor M11 is coupled to the second pull-up node Q, a first electrode of the second output transistor M11 is coupled to a fourth clock signal terminal CLK2, and a second electrode of the second output transistor M11 is coupled to the drive output terminal OUT.

One terminal of the second storage capacitor C1 is coupled to the second pull-up node Q, and the other terminal of the second storage capacitor C1 is coupled to the drive output terminal OUT.

As can be seen from FIG. 5 to FIG. 7, the third clock signal terminal CLK1 and the fourth clock signal terminal CLK2 are coupled to the clock terminal CLKA or the clock terminal CLKB.

With reference to FIG. 9, the operation principle of the shift register unit GOA is described as follows.

The pull-up transistor M1 controls, based on the potential of the signal received by the first input terminal IN1, the coupling or decoupling between the first input drive terminal CN and the second pull-up node Q, to charge the second pull-up node Q.

The reset transistor M2 controls, based on the potential of the signal received by the first reset terminal STD1, the coupling or decoupling between the second input drive terminal CNB and the second pull-up node Q, to reduce noise for the second pull-up node Q for resetting.

The total reset transistor M3 controls, based on the total reset signal provided by the total reset terminal TRS, the coupling or decoupling between the second power supply terminal VGL and the second pull-up node Q, to reduce noise for the second pull-up node Q for resetting.

The first pull-down control transistor M4 controls, based on the clock signal provided by the second clock signal terminal CLK9, the coupling or decoupling between the second clock signal terminal CLK9 and the second pull-down node QB, to control the potential of the second pull-down node QB. The second pull-down control transistor M5 controls, based on the potential of the second pull-up node Q, the coupling or decoupling between the second power supply terminal VGL and the second pull-down node QB, to control the potential of the second pull-down node QB. The third pull-down control transistor M6 controls, based on the signal output by the shift output terminal CR1, the coupling or decoupling between the second power supply terminal VGL and the second pull-down node QB, to control the potential of the second pull-down node QB.

The first pull-down transistor M7 controls, based on the potential of the second pull-down node QB, the coupling or decoupling between the second power supply terminal VGL and the second pull-up node Q, to pull down the potential of the second pull-up node Q and reduce noise for the second pull-up node Q. The second pull-down transistor M8 controls, based on the potential of the second pull-down node QB, the coupling or decoupling between the second power supply terminal VGL and the shift output terminal CR1, to pull down the potential of the shift output terminal CR1 and reduce noise for the shift output terminal CR1. The third pull-down transistor M9 controls, based on the potential of the second pull-down node QB, the coupling or decoupling between the second power supply terminal VGL and the drive output terminal OUT, to pull down the potential of the drive output terminal OUT and reduce noise for the drive output terminal OUT.

The first output transistor M10 controls, based on the potential of the second pull-up node Q, the coupling or decoupling between the third clock signal terminal CLK1 and the shift output terminal CR1, to transmit the required signal (for example, the input signal stu or the reset signal std) to the cascaded unit via the shift output terminal CR1. The second output transistor M11 may control, based on the potential of the second pull-up node Q, the coupling or decoupling between the fourth clock signal terminal CLK2 and the drive output terminal OUT, to transmit a gate drive signal to at least one row of pixels P1 via the drive output terminal OUT, to drive the at least one row of pixels P1 to emit light.

The second storage capacitor C1 is configured to store the potential of the second pull-up node Q, to ensure the good stability of the potential of the second pull-up node Q.

Figure 11:
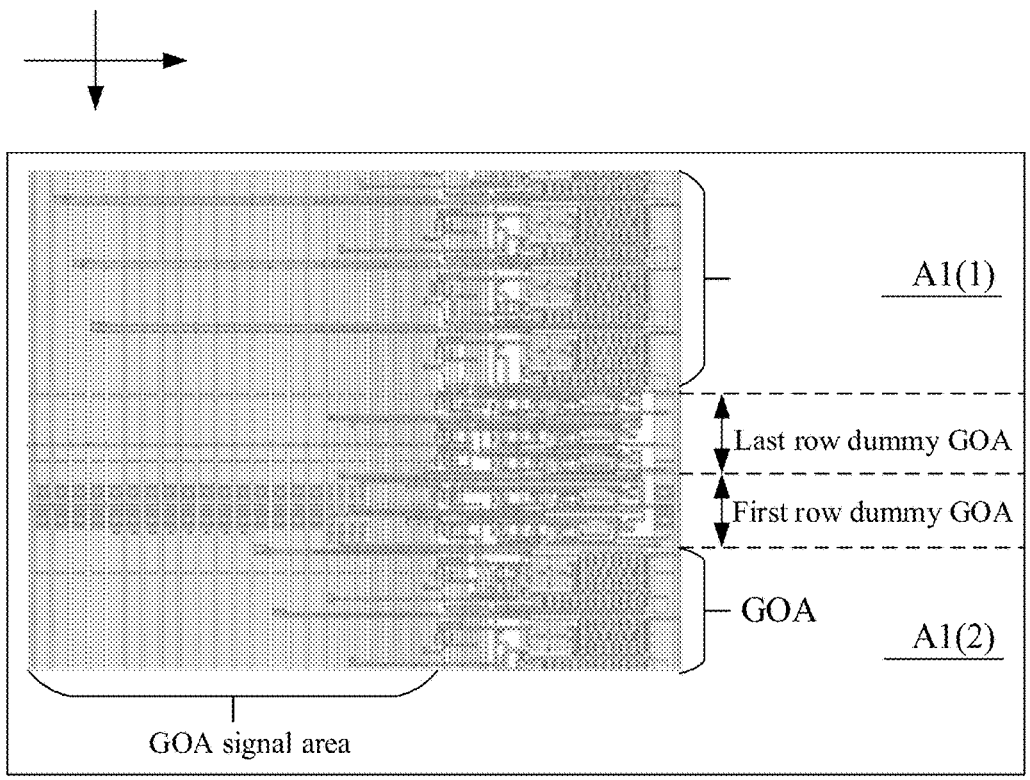
FIG. 11 is a structural layout of a gate driver circuit according to some embodiments of the present disclosure.

In some embodiments, by taking the structures shown in FIG. 5, FIG. 6, FIG. 9, and FIG. 10 as an example, FIG. 11 further shows a structural layout of a gate driver circuit, and FIG. 11 shows the portion in the display partitions A1(1) and A1(2). As can be seen from FIG. 11, along the column direction Y1, in two adjacent display partitions A1, the shift register unit GOA and the last row dummy GOA included in the display area A1(1) are arranged in sequence, and the first row dummy GOA and the shift register unit GOA included in the other display partition A1(2) are arranged in sequence. That is, the first row dummy GOA and the last row dummy GOA within two adjacent display partitions are adjacent and are in contact with each other. In addition, FIG. 11 schematically shows a GOA signal area, that is, the area in which the shift register unit GOA transmits the gate drive signal to the pixels P1.

It should be noted that, as can be seen with reference to the above embodiments, the dummy GOAs (including the first row dummy GOA and the last row dummy GOA) in the embodiments of the present disclosure are not coupled to the pixels P1 and do not need to output signals to the pixels P1, but only need to be coupled to the shift register units GOA in the shift register group 011, to transmit shift signals (including the input signal stu and the reset signal std) to the shift register units GOA. In the embodiments of the present disclosure, each shift register unit GOA in the shift register group 011 is not only coupled to the pixels to transmit the signal to the pixels P1 based on a received signal to light the pixels P1, but also coupled to other cascaded shift register unit GOA to transmit the shift signal to the other shift register unit GOA.

Thus, in the embodiments of the present disclosure, the dummy GOA that is not coupled to the pixels P1 may have a low driving capacity, while the shift register unit GOA that is coupled to the pixels P1 and other shift register units GOA may have a high driving capacity. Accordingly, the dummy GOA that is not coupled to the pixels P1 and the shift register unit GOA that is coupled to the pixels P1 have the same equivalent circuit, but have transistors of different sizes.

For example, the size of the transistor included in the dummy GOA not coupled to the pixels P1 (referring to FIG. 9) is smaller than the size of the transistor included in the shift register unit GOA coupled to the pixels P1 (referring to FIG. 10). The transistors herein refer to the output transistors. For example, the output transistor in the dummy GOA refers to the fifth transistor T5 shown in FIG. 9. The output transistor in the shift register unit GOA refers to the first output transistor M10 and the second output transistor M11 in FIG. 10. The size of the transistor refers to the width to length ratio of the transistor. On this basis, it can further be determined that the width of each dummy GOA is smaller than the width of the shift register unit GOA coupled to the pixels P1.

In some embodiments, transistors in the embodiments of the present disclosure are thin film transistors, field effect transistors, or other devices having the same characteristics. The transistors in the embodiments of the present disclosure are mainly switching transistors based on their functions in circuits. Because the source and the drain of the switching transistor are symmetrical, the source and the drain are interchangeable. In the embodiments of the present disclosure, the source is referred to as the first electrode and the drain is referred to as the second electrode. According to the form in the accompanying drawings, a middle terminal of the transistor is the gate, a signal input terminal is the source, and a signal output terminal is the drain. In addition, the switching transistors in the embodiments of the present disclosure includes a P-type switching transistor and an N-type switching transistor. The P-type switching transistor is turned on when the gate is at a low level and turned off when the gate is at a high level. The N-type switching transistor is turned on when the gate is at the high level and turned off when the gate is at the low level. In addition, the plurality of signals in the embodiments of the present disclosure each have a high potential and a low potential, and the effective potential of the signal is the potential that turns on the switching transistor. For example, for the P-type switching transistor, the low potential is the effective potential, and for the N-type switching transistor, the high potential is the effective potential.

In summary, the embodiments of the present disclosure provide a gate driver circuit. The gate driver sub-circuit in the gate driver circuit includes at least two shift register groups, at least two first dummy units and at least two second dummy units. Each shift register group includes a plurality of shift register units whose output terminals and input terminals are cascaded in sequence, and the output terminals and reset terminals of the shift register units in the at least two shift register groups are also cascaded in sequence. The at least two first dummy units and the at least two second dummy units are both coupled to the at least two shift register groups and can provide input signals and reset signals for the at least two shift register groups, such that each shift register unit can transmit an input signal to the input terminal of another cascaded shift register unit and can transmit a reset signal to the reset terminal of another cascaded shift register unit. In this way, the gate drive signals output by the shift register units to the pixels are the same, and the luminance uniformity of the plurality of rows of pixels in the display panel is better.

Figure 12:
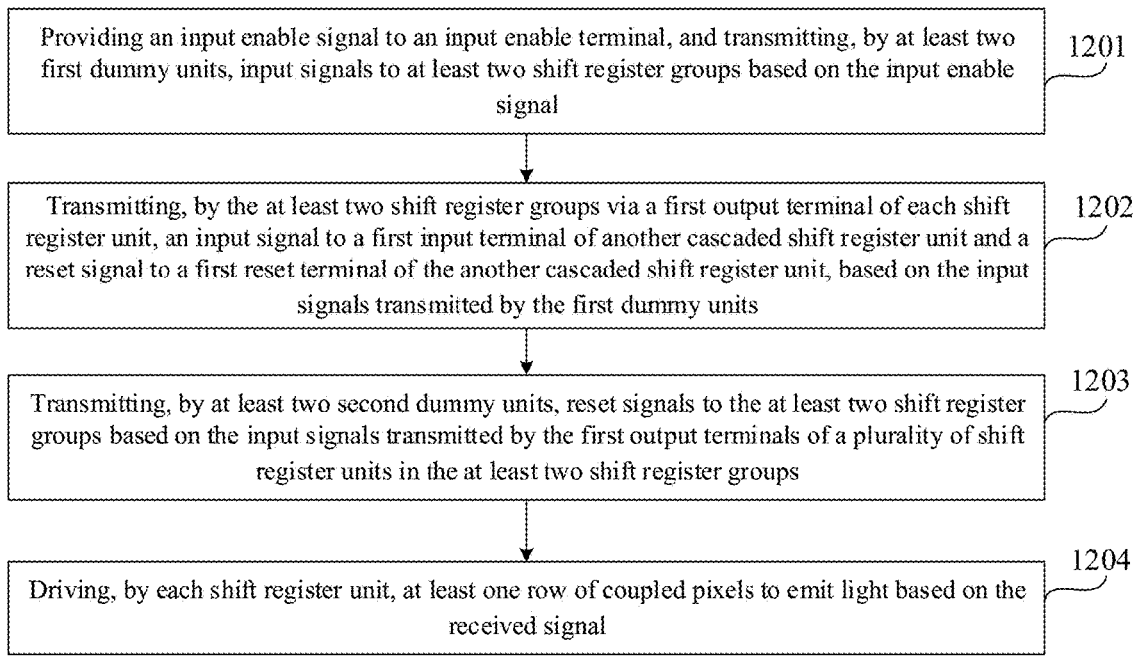
FIG. 12 is a flowchart of a method for driving a gate driver circuit according to some embodiments of the present disclosure.

FIG. 12 is a flowchart of a method for driving a gate driver circuit according to some embodiments of the present disclosure. The method is applicable to the gate driver circuit in the above embodiments. As shown in FIG. 12, the method includes the following steps.

In step 1201, an input enable signal is provided to an input enable terminal, and at least two first dummy units transmit input signals to at least two shift register groups based on the input enable signal.

In step 1202, the at least two shift register groups transmit, via a first output terminal of each shift register unit, an input signal to a first input terminal of another cascaded shift register unit and a reset signal to a first reset terminal of another cascaded shift register unit based on the input signals transmitted by the first dummy units.

In step 1203, at least two second dummy units transmit reset signals to the at least two shift register groups based on input signals transmitted by the first output terminals of a plurality of shift register units in the at least two shift register groups.

In step 1204, each shift register unit drives, based on the received signal, at least one row of coupled pixels to emit light.

Figure 13:
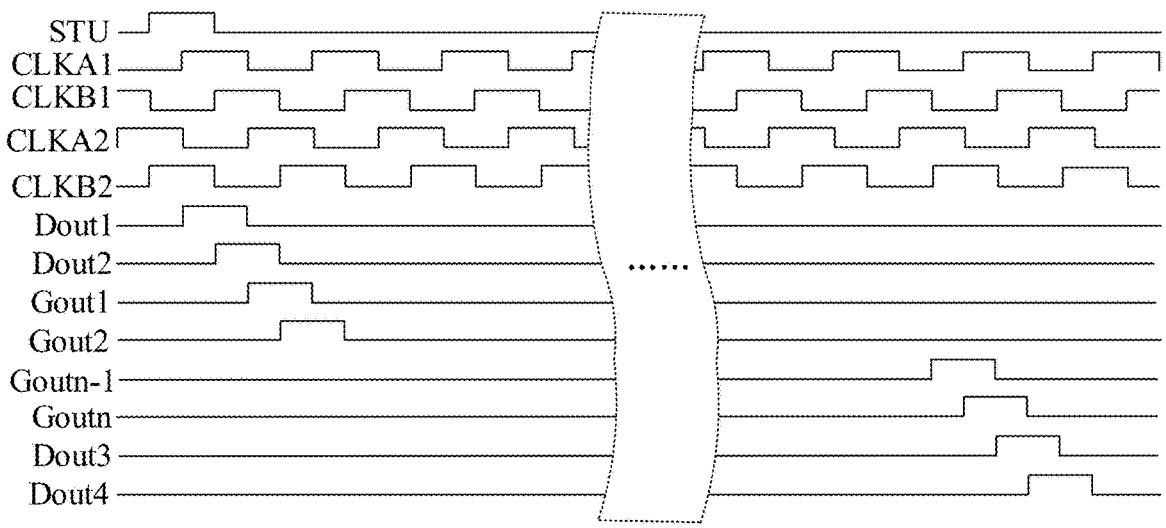
FIG. 13 is a timing diagram of signal terminals coupled to a gate driver circuit according to some embodiments of the present disclosure.

In some embodiments, FIG. 13 shows a signal timing diagram of a gate driver sub-circuit by taking the structures shown in FIG. 5 and FIG. 9 and the first potential being a high potential relative to the second potential as an example.

As can be seen from FIG. 13A, a potential of a clock signal CLKA1 provided by a clock terminal CLKA(1) is complementary to a potential of a clock signal CLKA2 provided by a clock terminal CLKA(2), that is, the potentials are opposite in the same time period. A potential of the clock signal CLKB1 provided by a clock terminal CLKB(1) is complementary to a potential of a clock signal CLKB2 provided by a clock terminal CLKB(2). Furthermore, the potential of the clock signal CLKA1, the potential of the clock signal CLKB1, the potential of the clock signal CLKA2 and the potential of the clock signal CLKB2 jump sequentially, that is, jump from the first potential to the second potential, or from the second potential to the first potential. There is an overlap between the periods when every two adjacent clock signals are at the same potential. For example, with reference to FIG. 13, there is a 50% overlap.

On this basis, first, the input enable terminal STU provides an input enable signal at the first potential, such that the first dummy unit 012 transmits the input signal stu to the first stage of shift register unit GOA cascaded thereto via the second output terminal CR0. Here, the input signal stu is the clock signal provided by the first clock signal terminal CLKD coupled to the first dummy unit 012. Then, from the first stage of the shift register unit GOA, each stage of shift register unit GOA sequentially transmits, via its shift output terminal CR1, the input signal stu to the next stage of shift register unit GOA cascaded thereto. Here, the input signal stu is the clock signal provided by the third clock signal terminal CLK1 coupled to the shift register unit GOA. Each stage of shift register unit GOA further sequentially transmits, via its shift output terminal CR1, the reset signal std to the previous stage of shift register unit GOA cascaded thereto or the first dummy unit 012. Here, the reset signal std is also the clock signal provided by the third clock signal terminal CLK1 coupled to the shift register unit GOA. The second dummy unit 013 further generates the reset signal std based on the input signal stu transmitted by the last stage of shift register unit GOA and transmits the reset signal std to the cascaded shift register unit GOA. Here, the reset signal std is the clock signal provided by the first clock signal terminal CLKD coupled to the second dummy unit 013.

In FIG. 13, Dout1 represents a signal output from the second output terminal of the first dummy unit 012(1) in FIG. 5. Dout2 represents a signal output from the second output terminal of the first dummy unit 012(2) in FIG. 5. Gout1 represents a signal output from the first output terminal of the first stage of shift register unit GOA(1) in FIG. 5. Gout2 represents a signal output from the first output terminal of the second stage of shift register unit GOA(2) in FIG. 5. Goutn-1 represents a signal output from the first output terminal of the $(n-1)^{th}$ stage of shift register unit GOA(n-1) in FIG. 5. Goutn represents a signal output from the first output terminal of the $n^{th}$ stage of shift register unit GOA(n) in FIG. 5. Dout3 represents a signal output from the second output terminal of the second dummy unit 013(1) in FIG. 5. Dout4 represents a signal output from the second output terminal of the second dummy unit 013(2) in FIG. 5. The ellipsis represents the signals output from the third stage of shift register unit GOA(3) to the $(n-2)^{th}$ stage of shift register unit GOA(n-2). As can be seen from FIG. 13, Dout1, Dout2, Gout1, Gout2, Goutn-1, Goutn, Dout3 and Dout4 are at the first potential sequentially, and there is an overlap between the periods when two adjacent signals are simultaneously at the first potential.

In summary, the embodiments of the present disclosure provide a method for driving a gate driver circuit. In the method, at least two first dummy units and at least two second dummy units included in the gate driver circuit can provide input signals and reset signals to the at least two shift register groups, such that each shift register unit can transmit the input signal to the input terminal of another cascaded shift register unit, and can transmit the reset signal to the reset terminal of another cascaded shift register unit. In this way, the gate drive signals output by the shift register units to the pixels are the same, and the luminance uniformity of the plurality of rows of pixels in the display panel is better.

Figure 14:
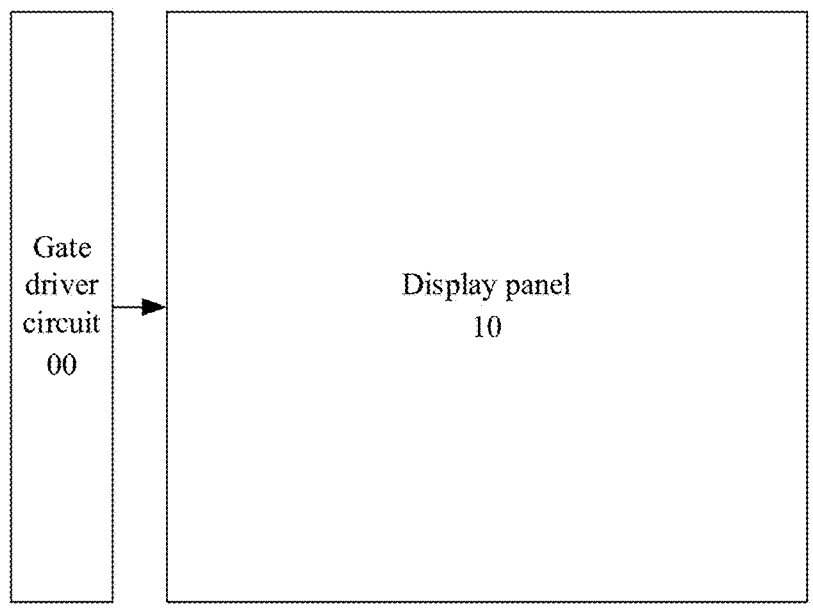
FIG. 14 is a schematic structural diagram of a display device according to some embodiments of the present disclosure.

FIG. 14 is a schematic structural diagram of a display device according to some embodiments of the present disclosure. As shown in FIG. 14, the display device includes a display panel 10 and the gate driver circuit 00 shown in the above embodiments.

Figure 15:
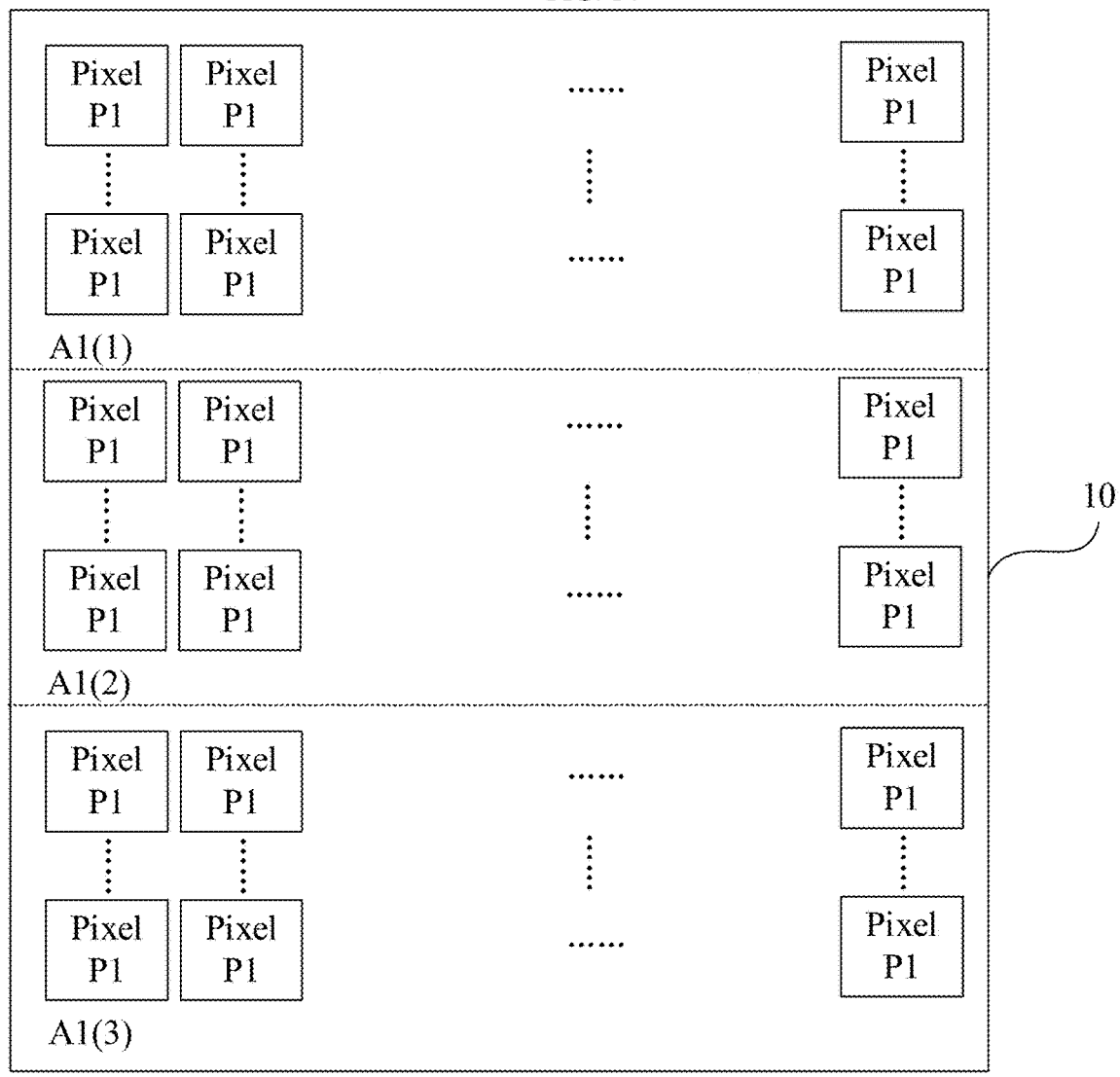
FIG. 15 is a schematic structural diagram of a display panel according to some embodiments of the present disclosure.

As can be seen from FIG. 15, the display panel 10 includes a plurality of rows of pixels P1. The gate driver circuit 00 is coupled to the plurality of rows of pixels P1, to drive the plurality of rows of pixels P1 to emit light. For example, the gate driver circuit 00 transmits gate drive signals to the plurality of rows of pixels P1, to drive the plurality of rows of pixels P1 to emit light.

In addition, the display device further includes a source driver circuit (also referred to as a data driver) and a timing controller. Each row of pixels P1 include a plurality of columns of pixels P1. The gate driver circuit 00 is coupled to each row of pixels P1 through a gate line G1, and the source driver circuit is coupled to each column of pixels P1 through a data line. That is, each pixel P1 is coupled to the gate driver circuit 00 through the gate line G1 and coupled to the source driver circuit through the data line. The source driver circuit and the gate driver circuit 00 are further coupled to the timing controller and provide, under the control of the timing controller, the gate drive signal and the data signal to the coupled gate line G1 and data line respectively. Each pixel P1 can emit light based on the received gate drive signal and data signal. The luminance of the pixel P1 is positively correlated with the potential of the data signal. Specifically, the higher the potential of the data signal, the stronger the luminance; conversely, the lower the potential of the data signal, the weaker the luminance.

In some embodiments, the gate driver circuit 00 generally includes a gate drive integrated circuit independent of the display panel, or a panel gate driver circuit integrated in the display panel. Since the separate gate drive integrated circuit is not conducive to the narrow bezel design and low cost, the panel gate driver circuit is gaining attention. The gate driver circuit 00 in the embodiments of the present disclosure is a panel gate driver circuit integrated in the display panel.

In some embodiments, as can be seen with reference to FIG. 3, FIG. 4 and FIG. 15, the display panel 10 in the embodiments of the present disclosure has a plurality of display partitions A1, and each display partition A1 includes at least two rows of pixels P1.

In some embodiments, the display partitions A1 includes the same number of rows of pixels, that is, all rows of pixels P1 included in the display panel are evenly distributed in the display partitions A1, which can ensure the display uniformity of the display partitions A1. For example, FIG. 15 schematically shows five display partitions A1(1) to A1(5), and each display partition A1 includes 240 rows of pixels P1. Certainly, in some embodiments, at least two display partitions A1 includes different numbers of rows of pixels. For example, with reference to FIG. 15, the number of rows of pixels included in the display partition A1(1) is different from the number of rows of pixels included in the display partition A1(2).

In some embodiments, with reference to FIG. 2, the gate driver circuit in the embodiments of the present disclosure includes a plurality of gate driver sub-circuits 01 disposed in the plurality of display partitions A1. Each gate driver sub-circuit 01 includes at least two shift register groups 011, at least two first dummy units 012 and at least two second dummy units 013. Each shift register group 011 includes a plurality of shift register units GOA.

On this basis, for each display partition A1, the width of the display partition A1 is greater than or equal to the total width of the plurality of rows of pixels P1 in the display partition A1, and greater than or equal to the total width of the shift register units GOA, the first dummy units 012 and the second dummy units 013 in the gate driver sub-circuit coupled to the plurality of rows of pixels P1 in the display partition A1.

For example, for each display partition A1, the total width of the shift register unit GOA, the first dummy units 012 and the second dummy units 013 in the gate driver sub-circuit coupled to the plurality of rows of pixels P1 in the display partition A1 is less than or equal to the total width of the plurality of rows of pixels P1 in the display partition A1.

For example, for each display partition A1, the width of the display partition A1 is equal to the total width of the plurality of rows of pixels P1 in the display partition A1. The total width of the shift register units GOA, the first dummy units 012 and the second dummy units 013 in the gate driver sub-circuit coupled to the plurality of rows of pixels P1 in the display partition A1 is equal to the total width of the plurality of rows of pixels P1 in the display partition A1.

Therefore, the width of each shift register unit GOA is less than the width of one row of coupled pixels P1. The width of each first dummy unit 012 and the width of each second dummy unit 013 are less than the width of each shift register unit GOA. In this way, space at the beginning and the end can be reserved for the layout of the dummy GOAs.

According to the above embodiments, the first dummy unit 012 is referred to as the first row dummy GOA and the second dummy unit 013 is referred to as the last row dummy GOA. The width of each row of pixels P1 is referred to as the pixel pitch. The width of each shift register unit GOA is referred to as the GOA pitch. Currently, the GOA pitch is equal to the pixel pitch in a display device without the dummy GOA. Therefore, in the embodiments of the present disclosure, the GOA pitch is obtained by reducing the pixel pitch to a certain pitch, such that the space at the beginning and end of the display partition A1 can be reserved for the layout of the dummy GOAs. The width direction is parallel to the column direction of the pixels.

Figure 16:
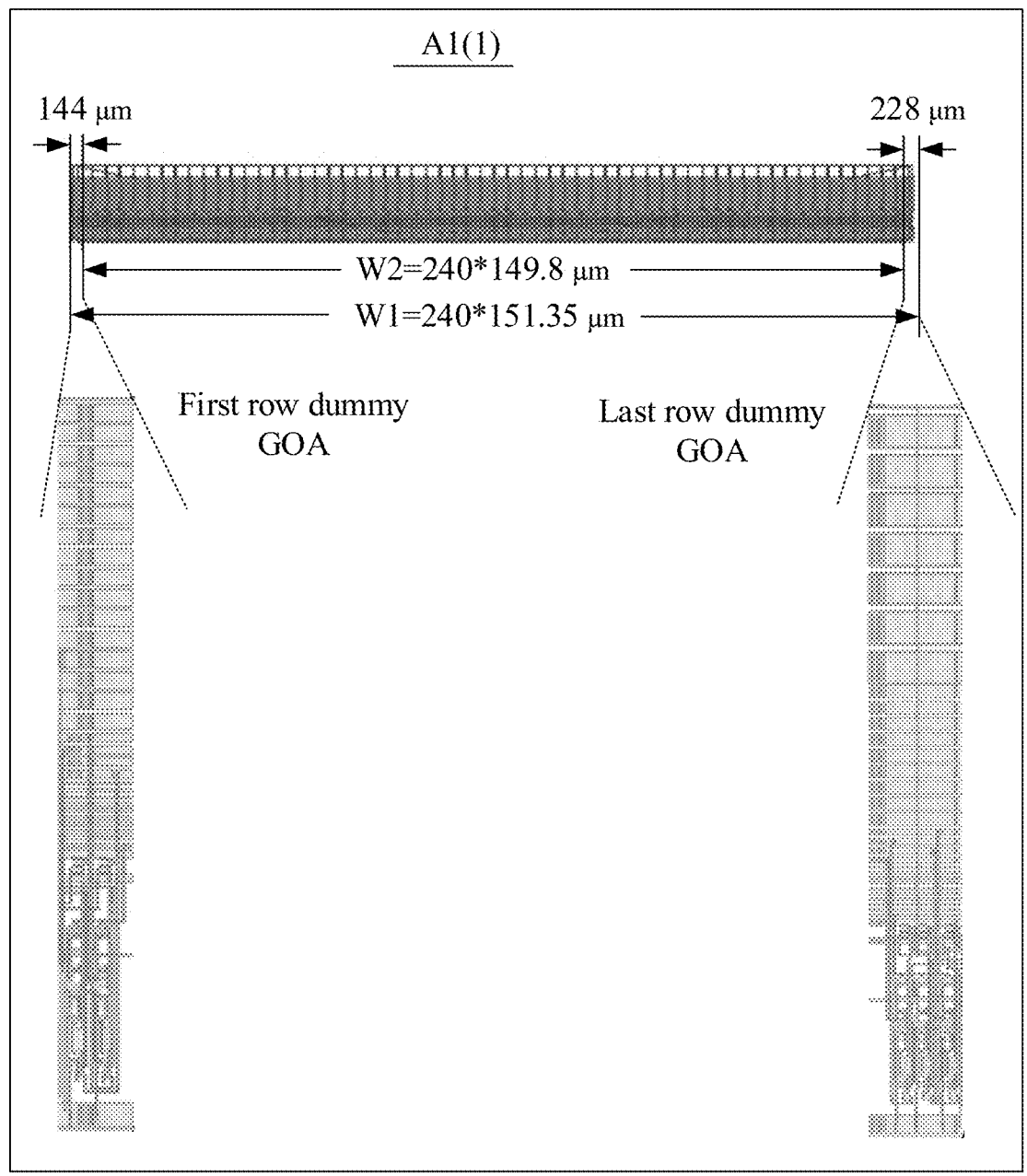
FIG. 16 is a schematic structural diagram of a display partition of a display device according to some embodiments of the present disclosure.

For example, FIG. 16 is an equivalent schematic diagram of the display partition A1(1). The display partition A1(1) includes 240 rows of pixels, and the width of each row of pixels P1 is 151.35 μm. Accordingly, it can be determined that the total width w1 of the 240 rows of pixels P1 in the display partition A1(1) is 240*151.35 μm. The width of the display partition A1(1) is equal to the total width w1 of the 240 rows of pixels P1. In addition, the width of each shift register unit GOA is reduced from the current 151.35 μm to 149.8 μm. Accordingly, it can be determined that the total width w2 of the 240 shift register units GOA coupled to the 240 rows of pixels P1 is reduced from 240*151.35 μm to 240*149.8 μm. In this way, the total width w2 of the plurality of shift register units GOA in the display partition A1(1) is less than the total width w1 of the plurality of rows of pixels P1. On this basis, the remaining width of the display partition A1(1) is 240*151.35 μm−240*149.8 μm=372 μm. Still referring to FIG. 16, it can be seen that 144 μm of 372 μm may be reserved at the beginning for the layout of the first dummy unit 012, that is, for the layout of the first row dummy GOA; and 228 μm may be reserved at the end for the layout of the second dummy unit 013, that is, for the layout of the last row dummy GOA. Certainly, this is only an example size and this is not limited in the embodiments of the present disclosure. For example, in some embodiments, the size of the bezel is enlarged to dispose the dummy GOA.

In some embodiments, the display device in the embodiments of the present disclosure is any product or component with a display function, such as an OLED display device, a mobile phone, a tablet computer, a TV, a display or a notebook computer.

It should be noted that the terms used in the embodiments of the present disclosure are merely used to explain the embodiments of the present disclosure, and are not intended to limit the present disclosure. Unless otherwise defined, the technical or scientific terms used in the embodiments of the present disclosure should have the generally meaning understood by those of ordinary skill in the field to which the present disclosure belongs.

In the embodiments of the present disclosure, the terms "first", "second", "third", and "fourth" are merely used for the purpose of description and should not be constructed as indicating or implying relative importance. The term "a plurality of" means two or more, unless otherwise specifically defined.

Similarly, the terms "one", "a/an", and similar words are not meant to be limiting, but rather denote the presence of at least one.

"Comprising", "including", and similar words mean that the element or article appearing before "comprising" or "consisting" includes the elements or articles and their equivalent elements appearing behind "comprising" or "consisting", not excluding any other elements or articles.

"Upper", "lower", "left", "right", and the like are merely used to indicate a relative positional relationship, and when the absolute position of the described object is changed, the relative positional relationship is changed accordingly.

The term "and/or" indicates three types of relationships. For example, "A and/or B" indicates that A exists alone, A and B coexist, or B exists alone. The character "/" usually indicates an "or" relationship between associated objects.

The foregoing descriptions are merely optional embodiments of the present disclosure and are not intended to limit the present disclosure. Any modifications, equivalent replacements, and improvements within the spirit and principles of the present disclosure shall be included within the protection scope of the present disclosure.

What is claimed is:

1. A gate driver circuit, applicable to a display panel, wherein the display panel comprises a plurality of rows of pixels: the gate driver circuit comprising at least one gate driver sub-circuit: wherein the gate driver sub-circuit comprises:
   at least two shift register groups, wherein each shift register group comprises a plurality of shift register units, first output terminals and first input terminals of the plurality of shift register units in each shift register group are sequentially cascaded, and first output terminals and first reset terminals of the plurality of shift register units in the at least two shift register groups are sequentially cascaded:

at least two first dummy units, wherein the at least two first dummy units are respectively coupled to a same input enable terminal and the at least two shift register groups, and the at least two first dummy units are configured to transmit input signals to the at least two shift register groups based on an input enable signal provided by the input enable terminal, such that each shift register unit transmits the input signal to the first input terminal of another cascaded shift register unit and transmits a reset signal to the first reset terminal of another cascaded shift register unit via the first output terminal; and at least two second dummy units, wherein the at least two second dummy units are coupled to the at least two shift register groups and configured to transmit reset signals to the at least two shift register groups based on input signals transmitted by the first output terminals of the plurality of shift register units in the at least two shift register groups:

wherein the first output terminal of each shift register unit is further coupled to at least one row of pixels, and each shift register unit is configured to drive, based on the received signal, the at least one row of pixels to emit light.

2. The gate driver circuit according to claim 1, wherein the display panel comprises a plurality of display partitions, and each display partition comprises at least two rows of pixels; and the gate driver circuit comprises:
a plurality of gate driver sub-circuits disposed in the plurality of display partitions.

3. The gate driver circuit according to claim 2, comprising: two gate driver sub-circuits disposed in each of the display partitions, wherein the two gate driver sub-circuits are oppositely arranged on two sides of the plurality of rows of pixels in a row direction.

4. The gate driver circuit according to claim 3, wherein
each row of pixels comprises a plurality of columns of pixels, and the plurality of display partitions are sequentially arranged along a column direction;
the gate driver sub-circuits disposed on a same side are sequentially arranged along the column direction; and
the first dummy units, the plurality of shift register units, and the second dummy units in each gate driver sub-circuit are sequentially arranged along the column direction.

5. The gate driver circuit according to claim 2, wherein the first dummy units in the plurality of gate driver sub-circuits share the same input enable terminal.

6. The gate driver circuit according to claim 1, wherein the first output terminals and the first reset terminals of the plurality of shift register units in each shift register group are sequentially cascaded:
a number of the first dummy units in the gate driver sub-circuit is equal to a number of the shift register groups in the gate driver sub-circuit, and the first dummy units are in one-to-one correspondence with the shift register groups; and
a number of the second dummy units in the gate driver sub-circuit is equal to the number of the shift register groups in the gate driver sub-circuit, and the second dummy units are in one-to-one correspondence with the shift register groups.

7. The gate driver circuit according to claim 6, wherein the gate driver sub-circuit comprises: two shift register groups, and two first dummy units and two second dummy units that are both in one-to-one correspondence with the two shift register groups; and a cascade sequence of the units in the gate driver sub-circuit is as follows:
in each shift register group, a second output terminal of the first dummy unit is coupled to the first input terminal of a first stage of shift register unit, a second input terminal of the first dummy unit is coupled to the input enable terminal, and a second reset terminal of the first dummy unit is coupled to the first output terminal of the first stage of shift register unit:
in each shift register group, a second output terminal of the second dummy unit is coupled to the first reset terminal of a last stage of shift register unit, and a second input terminal of the second dummy unit is coupled to the first output terminal of the last stage of shift register unit; and
in each shift register group, from the first stage of shift register unit to the last stage of shift register unit, the first output terminal of a previous stage of shift register unit is coupled to the first input terminal of a next stage of shift register unit, and the first output terminal of the next stage of shift register unit is coupled to the first reset terminal of the previous stage of shift register unit.

8. The gate driver circuit according to claim 7, wherein in the two shift register groups, one of the two shift register groups comprises even number stages of shift register units and the other shift register group comprises odd number stages of shift register units.

9. The gate driver circuit according to claim 1, wherein
the first output terminals of the plurality of shift register units in each shift register group are coupled to the first reset terminals of the plurality of shift register units in another shift register group;
a number of the first dummy units in the gate driver sub-circuit is equal to a number of the shift register groups in the gate driver sub-circuit, and the first dummy units are in one-to-one correspondence with the shift register groups; and
a number of the second dummy units in the gate driver sub-circuit is equal to a difference between stage numbers of two shift register units whose first output terminal and first reset terminal are cascaded in the plurality of shift register units in the at least two shift register groups.

10. The gate driver circuit according to claim 9, wherein
in the plurality of shift register units in the at least two shift register groups, the first output terminal of an $(n+3)^{th}$ stage of shift register unit is coupled to the first reset terminal of an $n^{th}$ stage of shift register unit, wherein n is greater than 0 and less than or equal to a number of the plurality of shift register units in the at least two shift register groups:
the gate driver sub-circuit comprises: two shift register groups, two first dummy units in one-to-one correspondence with the two shift register groups, and three second dummy units; and
a cascade sequence of the units in the gate driver sub-circuit is as follows:
in each shift register group, a second output terminal of the first dummy unit is coupled to the first input terminal of a first stage of shift register unit, a second input terminal of the first dummy unit is coupled to the input enable terminal, and a second reset terminal of the first dummy unit is coupled to the first output terminal of the first stage of shift register unit in the other shift register group:

in the three second dummy units in the two shift register groups, second input terminals of first two second dummy units are respectively coupled to the first output terminals of the last stage of shift register units in the two shift register groups, a second input terminal of a last second dummy unit is coupled to a second output terminal of a first second dummy unit, and second output terminals of the three second dummy units are respectively coupled to the first reset terminals of the last three stages of shift register units in the plurality of shift register units in the at least two shift register groups; and in each shift register group, from the first stage of shift register unit to the last stage of shift register unit, the first output terminal of a previous stage of shift register unit is coupled to the first input terminal of a next stage of shift register unit.

11. The gate driver circuit according to claim 1, wherein the first dummy unit and the second dummy unit each comprise: a pull-up sub-circuit, a pull-down sub-circuit, an inverter sub-circuit and an output sub-circuit: wherein the pull-up sub-circuit is coupled to a second input terminal, a first power supply terminal and a first pull-up node, and the pull-up sub-circuit is configured to control coupling or decoupling between the first power supply terminal and the first pull-up node based on a signal received by the second input terminal:

the pull-down sub-circuit is coupled to a second reset terminal, a second power supply terminal, a first pull-down node, the first pull-up node and a second output terminal, and the pull-down sub-circuit is configured to control coupling or decoupling between the second power supply terminal and the first pull-up node based on a signal received by the second reset terminal and a potential of the first pull-down node, and control coupling or decoupling between the second power supply terminal and the second output terminal based on the potential of the first pull-down node:

the inverter sub-circuit is coupled to the first pull-up node and the first pull-down node, and the inverter sub-circuit is configured to invert a potential of the first pull-up node and transmit the potential to the first pull-down node; and the output sub-circuit is coupled to the first pull-up node, a first clock signal terminal and the second output terminal, and the output sub-circuit is configured to control coupling or decoupling between the first clock signal terminal and the second output terminal based on the potential of the first pull-up node.

12. The gate driver circuit according to claim 11, wherein the pull-up sub-circuit comprises a first transistor, the pull-down sub-circuit comprises a second transistor, a third transistor and a fourth transistor, the inverter sub-circuit comprises an inverter, and the output sub-circuit comprises a first storage capacitor and a fifth transistor:

wherein a gate of the first transistor is coupled to the second input terminal, a first electrode of the first transistor is coupled to the first power supply terminal, and a second electrode of the first transistor is coupled to the first pull-up node:

a gate of the second transistor is coupled to the second reset terminal, a first electrode of the second transistor is coupled to the second power supply terminal, and a second electrode of the second transistor is coupled to the first pull-up node:

a gate of the third transistor is coupled to the first pull-down node, a first electrode of the third transistor is coupled to the second power supply terminal, and a second electrode of the third transistor is coupled to the first pull-up node:

an input terminal of the inverter is coupled to the first pull-up node, and an output terminal of the inverter is coupled to the first pull-down node:

a gate of the fourth transistor is coupled to the first pull-down node, a first electrode of the fourth transistor is coupled to the second power supply terminal, and a second electrode of the fourth transistor is coupled to the second output terminal;

a gate of the fifth transistor is coupled to the first pull-up node, a first electrode of the fifth transistor is coupled to the first clock signal terminal, and a second electrode of the fifth transistor is coupled to the second output terminal; and one terminal of the first storage capacitor is coupled to the first pull-up node, and the other terminal of the first storage capacitor is coupled to the second output terminal.

13. The gate driver circuit according to claim 1, wherein each shift register group is further coupled to two clock terminals, and the shift register groups are coupled to different clock terminals:

in each shift register group, clock signal terminals of two shift register units whose input terminal and output terminal are cascaded are respectively coupled to the two clock terminals, to receive clock signals provided by the two clock terminals; and clock signal terminals of the first dummy units are coupled to different clock terminals, clock signal terminals of the second dummy units are coupled to different clock terminals, and the different clock terminals are clock terminals coupled to the at least two shift register groups, and the first dummy units and the second dummy units are further configured to receive the clock signals.

14. The gate driver circuit according to claim 1, wherein the first output terminal of each shift register unit comprises a drive output terminal and a shift output terminal; wherein the drive output terminal is coupled to the at least one row of pixels, and the shift output terminal is coupled to the first input terminal of the cascaded shift register unit and the second reset terminal of the first dummy unit, or the second input terminal of the second dummy unit.

15. The gate driver circuit according to claim 14, wherein each shift register unit comprises: a pull-up transistor, a reset transistor, a total reset transistor, a first pull-down control transistor, a second pull-down control transistor, a third pull-down control transistor, a first pull-down transistor, a second pull-down transistor, a third pull-down transistor, a first output transistor, a second output transistor and a second storage capacitor: wherein a gate of the pull-up transistor is coupled to the first input terminal, a first electrode of the pull-up transistor is coupled to a first input drive terminal, and a second electrode of the pull-up transistor is coupled to a second pull-up node:

a gate of the reset transistor is coupled to the first reset terminal, a first electrode of the reset transistor is coupled to a second input drive terminal, and a second electrode of the reset transistor is coupled to the second pull-up node:

a gate of the total reset transistor is coupled to a total reset terminal, a first electrode of the total reset transistor is coupled to a second power supply terminal, and a second electrode of the total reset transistor is coupled to the second pull-up node:

a gate and a first electrode of the first pull-down control transistor are both coupled to a second clock signal terminal, and a second electrode of the first pull-down control transistor is coupled to a second pull-down node:

a gate of the second pull-down control transistor is coupled to the second pull-up node, a first electrode of the second pull-down control transistor is coupled to the second power supply terminal, and a second electrode of the second pull-down control transistor is coupled to the second pull-down node:

a gate of the third pull-down control transistor is coupled to the shift output terminal, a first electrode of the third pull-down control transistor is coupled to the second power supply terminal, and a second electrode of the third pull-down control transistor is coupled to the second pull-down node:

a gate of the first pull-down transistor is coupled to the second pull-down node, a first electrode of the first pull-down transistor is coupled to the second power supply terminal, and a second electrode of the first pull-down transistor is coupled to the second pull-up node:

a gate of the second pull-down transistor is coupled to the second pull-down node, a first electrode of the second pull-down transistor is coupled to the second power supply terminal, and a second electrode of the second pull-down transistor is coupled to the shift output terminal:

a gate of the third pull-down transistor is coupled to the second pull-down node, a first electrode of the third pull-down transistor is coupled to the second power supply terminal, and a second electrode of the third pull-down transistor is coupled to the drive output terminal:

a gate of the first output transistor is coupled to the second pull-up node, a first electrode of the first output transistor is coupled to a third clock signal terminal, and a second electrode of the first output transistor is coupled to the shift output terminal:

a gate of the second output transistor is coupled to the second pull-up node, a first electrode of the second output transistor is coupled to a fourth clock signal terminal, and a second electrode of the second output transistor is coupled to the drive output terminal; and one terminal of the second storage capacitor is coupled to the second pull-up node, and the other terminal of the second storage capacitor is coupled to the drive output terminal.

16. A method for driving a gate driver circuit, applicable to the gate driver circuit as defined in claim 1, the method comprising:

providing an input enable signal to an input enable terminal, and transmitting, by at least two first dummy units, input signals to at least two shift register groups based on the input enable signal:

transmitting, by the at least two shift register groups via a first output terminal of each shift register unit, an input signal to a first input terminal of another cascaded shift register unit and a reset signal to a first reset terminal of another cascaded shift register unit, based on the input signals transmitted by the first dummy units:

transmitting, by at least two second dummy units, reset signals to the at least two shift register groups based on the input signals transmitted by the first output terminals of a plurality of shift register units in the at least two shift register groups; and driving, by each shift register unit, at least one row of coupled pixels to emit light based on the received signal.

17. A display device, comprising: a display panel and a gate driver circuit; wherein the gate driver sub-circuit comprises:
at least two shift register groups, wherein each shift register group comprises a plurality of shift register units, first output terminals and first input terminals of the plurality of shift register units in each shift register group are sequentially cascaded, and first output terminals and first reset terminals of the plurality of shift register units in the at least two shift register groups are sequentially cascaded;

at least two first dummy units, wherein the at least two first dummy units are respectively coupled to a same input enable terminal and the at least two shift register groups, and the at least two first dummy units are configured to transmit input signals to the at least two shift register groups based on an input enable signal provided by the input enable terminal, such that each shift register unit transmits the input signal to the first input terminal of another cascaded shift register unit and transmits a reset signal to the first reset terminal of another cascaded shift register unit via the first output terminal; and at least two second dummy units, wherein the at least two second dummy units are coupled to the at least two shift register groups and configured to transmit reset signals to the at least two shift register groups based on input signals transmitted by the first output terminals of the plurality of shift register units in the at least two shift register groups:

wherein the first output terminal of each shift register unit is further coupled to at least one row of pixels, and each shift register unit is configured to drive, based on the received signal, the at least one row of pixels to emit light:

and the display panel comprises a plurality of rows of pixels, and the gate driver circuit is coupled to the plurality of rows of pixels and configured to drive the plurality of rows of pixels to emit light.

18. The display device according to claim 17, wherein the display panel comprises a plurality of display partitions, each of the display partitions comprises at least two rows of pixels, and the gate driver circuit comprises a plurality of gate driver sub-circuits disposed in the plurality of display partitions: wherein each of the gate driver sub-circuits comprises at least two shift register groups, at least two first dummy units and at least two second dummy units; and each shift register group comprises a plurality of shift register units:

wherein for each display partition, a width of the display partition is greater than or equal to a total width of a plurality of rows of pixels in the display partition, and greater than or equal to a total width of the shift register units, the first dummy units and the second dummy units in one gate driver sub-circuit coupled to the plurality of rows of pixels in the display partition.

19. The display device according to claim 18, wherein for each display partition, the total width of the shift register units, the first dummy units and the second dummy units in one gate driver sub-circuit coupled to the plurality of rows of pixels in the display partition is less than or equal to the total width of the plurality rows of pixels in the display partition.

20. The display device according to claim 19, wherein
the width of each shift register unit is less than a width of one row of coupled pixels; and
the width of each first dummy unit and the width of each second dummy unit are less than the width of each shift register unit.

* * * * *